US011990492B2

(12) United States Patent
Oshiyama et al.

(10) Patent No.: US 11,990,492 B2
(45) Date of Patent: *May 21, 2024

(54) SOLID-STATE IMAGING SENSOR

(71) Applicant: SONY GROUP CORPORATION, Tokyo (JP)

(72) Inventors: Itaru Oshiyama, Kanagawa (JP); Hiroshi Tanaka, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/086,774

(22) Filed: Dec. 22, 2022

(65) Prior Publication Data
US 2023/0126141 A1    Apr. 27, 2023

Related U.S. Application Data

(63) Continuation of application No. 17/387,127, filed on Jul. 28, 2021, now Pat. No. 11,557,621, which is a (Continued)

(30) Foreign Application Priority Data

Jun. 5, 2015    (JP) ................................. 2015-114525

(51) Int. Cl.
  *H01L 27/146*    (2006.01)
  *G02B 1/115*    (2015.01)
  (Continued)

(52) U.S. Cl.
  CPC ........ *H01L 27/14625* (2013.01); *G02B 1/115* (2013.01); *G02B 1/118* (2013.01); (Continued)

(58) Field of Classification Search
  CPC . H01L 27/14625; H01L 27/14; H01L 27/146; H01L 27/14621; H01L 27/14623; (Continued)

(56) References Cited

U.S. PATENT DOCUMENTS 5,306,926 A    4/1994  Yonemoto
10,263,025 B2    4/2019  Oshiyama et al.
(Continued)

FOREIGN PATENT DOCUMENTS

CN    1585134    2/2005
DE    69213510    4/1997
(Continued)

OTHER PUBLICATIONS

International Search Report and Written Opinion for International (PCT) Patent Application No. PCT/JP2016/065024, dated Aug. 2, 2016, 9 pages.

(Continued)

*Primary Examiner* — Calvin Y Choi
(74) *Attorney, Agent, or Firm* — Sheridan Ross PC

(57) ABSTRACT

The present technology relates to a solid state imaging sensor that is possible to suppress the reflection of incident light with a wide wavelength band. A reflectance adjusting layer is provided on the substrate in an incident direction of the incident light with respect to the substrate such as Si and configured to adjust reflection of the incident light on the substrate. The reflectance adjusting layer includes a first layer formed on the substrate and a second layer formed on the first layer. The first layer includes a concavo-convex structure provided on the substrate and a material which is filled into a concave portion of the concavo-convex structure and has a refractive index lower than that of the substrate, and the second layer includes a material having a refractive index lower than that of the first layer. It is possible to reduce the reflection on the substrate such as Si by using the principle of the interference of the thin film. Such a technology can be applied to solid state imaging sensors.

7 Claims, 19 Drawing Sheets

Related U.S. Application Data continuation of application No. 16/295,776, filed on Mar. 7, 2019, now Pat. No. 11,121,161, which is a continuation of application No. 15/574,558, filed as application No. PCT/JP2016/065024 on May 20, 2016, now Pat. No. 10,263,025.

(51) Int. Cl.
  *G02B 1/118* (2015.01)
  *H01L 27/14* (2006.01)
  *H04N 25/60* (2023.01)
  *H04N 25/70* (2023.01)

(52) U.S. Cl.
  CPC ............ *H01L 27/14* (2013.01); *H01L 27/146* (2013.01); *H01L 27/14621* (2013.01); *H01L 27/14623* (2013.01); *H01L 27/14627* (2013.01); *H01L 27/14645* (2013.01); *H01L 27/14685* (2013.01); *H04N 25/60* (2023.01); *H04N 25/70* (2023.01)

(58) Field of Classification Search
  CPC ......... H01L 27/14627; H01L 27/14645; H01L 27/14685
  USPC ........................................................ 257/435
  See application file for complete search history.

(56) References Cited

U.S. PATENT DOCUMENTS

| | | | |
|---|---|---|---|
| 11,121,161 B2 * | 9/2021 | Oshiyama | ......... H01L 27/14627 |
| 2002/0005471 A1 | 1/2002 | Suzuki | |
| 2005/0040440 A1 | 2/2005 | Murakami | |
| 2006/0077268 A1 | 4/2006 | Yokozawa | |
| 2006/0261426 A1 | 11/2006 | Hoague et al. | |
| 2007/0045642 A1 | 3/2007 | Li | |
| 2009/0250778 A1 | 10/2009 | Shimotsusa | |
| 2009/0278450 A1 | 11/2009 | Sonoyama et al. | |
| 2011/0108705 A1 | 5/2011 | Izuha et al. | |
| 2013/0037902 A1 | 2/2013 | Nakazawa et al. | |
| 2013/0182155 A1 | 7/2013 | Egawa | |
| 2014/0339663 A1 | 11/2014 | Siess et al. | |
| 2019/0194696 A1 | 6/2019 | Zhang et al. | |
| 2021/0358987 A1 | 11/2021 | Oshiyama et al. | |

FOREIGN PATENT DOCUMENTS

| | | |
|---|---|---|
| EP | 0502340 | 2/1992 |
| JP | H04-257261 | 9/1992 |
| JP | 2005-072097 | 3/2005 |
| JP | 2006019615 A | 1/2006 |
| JP | 2009-198626 | 9/2009 |
| JP | 2009-198627 | 9/2009 |
| JP | 2009-218357 | 9/2009 |
| JP | 2011-124522 | 6/2011 |
| JP | 2011-204746 | 10/2011 |
| JP | 2012175050 A | 9/2012 |
| JP | 2012-208257 | 10/2012 |
| JP | 2013-033864 | 2/2013 |
| JP | 2014-033052 | 2/2014 |
| JP | 2015-029054 | 2/2015 |
| KR | 100246059 | 3/2000 |
| KR | 10-2005-0020633 | 3/2005 |
| KR | 10-2011-0025942 | 3/2011 |
| TW | 200524147 | 3/2006 |

OTHER PUBLICATIONS

Official Action (no English translation available) for Japanese Patent Application No. 2017-521814, dated Jan. 16, 2020, 9 pages.
Official Action (no English translation available) for Japanese Patent Application No. 2017-521814, dated Apr. 28, 2020, 5 pages.
Official Action (with English translation) for Japan Patent Application No. 2017-521814, dated May 25, 2021, 6 pages.
Official Action for U.S. Appl. No. 15/574,558, dated May 3, 2018, 8 pages.
Notice of Allowance for U.S. Appl. No. 15/574,558, dated Nov. 28, 2018, 7 pages.
Official Action for U.S. Appl. No. 16/295,776, dated Sep. 30, 2020, 12 pages.
Notice of Allowance for U.S. Appl. No. 16/295,776, dated May 12, 2021, 7 pages.
Notice of Allowance for U.S. Appl. No. 17/387,127, dated Sep. 21, 2022, 9 pages.

* cited by examiner

SOLID-STATE IMAGING SENSOR

CROSS REFERENCE TO RELATED APPLICATIONS

This application is a continuation of U.S. patent application Ser. No. 17/387,127, filed Jul. 28, 2021, which is a continuation of U.S. patent application Ser. No. 16/295,776, filed Mar. 7, 2019, now U.S. Pat. No. 11,121,161, which is a continuation of U.S. patent application Ser. No. 15/574,558, filed Nov. 16, 2017, now U.S. Pat. No. 10,263,025, which claimed the benefit of PCT Application No. PCT/JP2016/065024, having an international filing date of May 20, 2016, which designated the United States, which PCT application claimed the benefit of Japanese Patent Application No. 2015-114525 filed Jun. 5, 2015, the disclosures of which are incorporated herein by reference in their entirety.

TECHNICAL FIELD

The present technology relates to a solid-state imaging sensor and, in particular, relates to a solid-state imaging sensor that can suppress the reflection of incident light with a wide wavelength band.

BACKGROUND ART

Small scale and multi-pixel are demanded to a solid-state imaging sensor. Therefore, reduction of pixels is developed. However, with the reduction of pixels, the sensitivity deteriorates, and thus it is demanded to compensate for the deterioration of sensitivity due to the reduction of an aperture ratio, and improve the sensitivity. In the solid-state imaging sensor, incident light is reflected on the surface of a Si substrate. Therefore, the intensity of light that reaches a light receiving portion is lost, and the sensitivity deteriorates, and the incident light from an unexpected light path causes flare and ghosts.

Accordingly, such a technology is proposed to effectively suppress the reflection of incident light on all wavelength regions (all visible light) of the incident light on a light receiving portion by forming a reflection preventing layer having a concavo-convex structure (also referred to as a moth-eye structure) corresponding to a wavelength region of incident light on the light receiving portion (refer to, e.g., Patent Literature 1).

CITATION LIST

Patent Literature

Patent Literature 1: JP2009-218357A

DISCLOSURE OF INVENTION

Technical Problem

Incidentally, in the case of using the moth-eye structure adopted in Patent Literature 1 described above, a deep concavo-convex structure with a narrow pitch is required. However, the level of difficulty is technically high to realize the structure with thickness less than, e.g., approximately 100 nm by processing, such as lithography or dry etching.

Further, in the case of using the moth-eye structure, as long as the thickness of at least approximately 100 nm is not ensured, the reflectance cannot be sufficiently reduced.

The present technology is devised under the situation. In particular, the interference principle of a thin film is applied to the surface of a Si substrate, thereby suppressing the reflection of incident light with a wide wavelength band.

Solution to Problem

According to an aspect of the present technology, a solid-state imaging sensor is a solid-state imaging sensor including: a substrate having, per pixel unit, a photoelectric conversion unit configured to generate a pixel signal corresponding to an amount of incident light by photoelectric conversion; a reflectance adjusting layer provided on the substrate in an incident direction of the incident light with respect to the substrate and configured to adjust reflection of the incident light on the substrate; and an environmental medium provided on the reflectance adjusting layer. The reflectance adjusting layer includes a first layer formed on the substrate and a second layer formed on the first layer. The first layer includes a concavo-convex structure provided on the substrate and a material which is filled into a concave portion of the concavo-convex structure and has a refractive index lower than that of the substrate. The second layer includes a material having a refractive index lower than that of the first layer. The refractive index of the substrate is higher than that of the first layer, the refractive index of the first layer is higher than that of the second layer, and the refractive index of the second layer is higher than that of the environmental medium.

A product of the refractive index of the first layer and a thickness of the first layer may be smaller than 3/8 times a wavelength of the incident light.

The first layer may include a plurality of layers, and in a refractive index of each of the plurality of layers, and the refractive index of a layer closer to the substrate may be higher among any adjacent layers. In the case where a difference in the refractive index between the respective layers is higher than a predetermined value, a product of the refractive index and the thickness may be smaller than 3/8 times the wavelength of the incident light in each of the plurality of layers. In the case where the difference in the refractive indexes between the respective layers is lower than a predetermined value, a sum of products of the refractive index and the thickness of each of the plurality of layers may be smaller than 3/8 times the wavelength of the incident light.

A product of the refractive index of the second layer and a thickness of the second layer may be smaller than 3/8 times the wavelength of the incident light.

The second layer may include a plurality of layers, and in a refractive index of each of the plurality of layers, the refractive index of a layer closer to the substrate may be higher among any adjacent layers. In the case where a difference in the refractive index between the respective layers is higher than a predetermined value, a product of the refractive index and the thickness may be smaller than 3/8 times the wavelength of the incident light in each of the plurality of layers. In the case where the difference in the refractive indexes between the respective layers is lower than a predetermined value, a sum of products of the refractive index and the thickness of each of the plurality of layers may be smaller than 3/8 times the wavelength of the incident light.

The refractive index of the first layer may be a sum of products of volume ratios with the respective refractive indexes of a convex portion in the concavo-convex structure of the first layer including the same material as that of the substrate and the concave portion to which the material with the low refractive index is filled.

The substrate includes Si and InGaAs, a material filled into a concave portion of the first layer may include an oxidized film or a nitride film containing at least one kind of Hf, Al, Ti, Zr, Ta, Nb, Y, and Sr, and the environmental medium may include a lens, a color filter, and an oxidized film.

A material filled into the concave portion of the first layer may include SiN, HfO2, Ta2O5, Nb2O5, TiO2, Al2O3, and ZrO2.

A material filled into the concave portion of the first layer may be the same material as that of the second layer.

A material filled into the concave portion of the first layer may be the material with high dielectric constant.

The concavo-convex structure provided on the substrate may be configured by using photolithography or etching using directed self assembly (DSA).

A boundary per the pixel unit may include an oxidized-film boundary portion including an oxidized film.

The pixel may include an image-plane phase difference focus pixel.

A boundary per the pixel unit may include a metallic boundary portion including a metal.

The metal may include tungsten.

The pixel may include an image-plane phase difference focus pixel.

The solid-state imaging sensor may include a light shielding unit which is the boundary per the pixel unit and which includes the same metal as that of the metallic boundary portion and shields the incident light onto an adjacent pixel to surround the pixel in a direction facing to an incident direction of the incident light.

The pixel may include an image-plane phase difference focus pixel.

According to an aspect of the present disclosure, a solid-state imaging sensor includes: a substrate having, per pixel unit, a photoelectric conversion unit configured to generate a pixel signal corresponding to an amount of incident light by photoelectric conversion; a reflectance adjusting layer provided on the substrate in an incident direction of the incident light with respect to the substrate and configured to adjust reflection of the incident light on the substrate; and an environmental medium provided on the reflectance adjusting layer. The reflectance adjusting layer includes a first layer formed on the substrate and a second layer formed on the first layer. The first layer includes a concavo-convex structure provided on the substrate and a material which is filled into a concave portion of the concavo-convex structure and has a refractive index lower than that of the substrate. The second layer includes a material having a refractive index lower than that of the first layer. The refractive index of the substrate is higher than that of the first layer, the refractive index of the first layer is higher than that of the second layer, and the refractive index of the second layer is higher than that of the environmental medium.

Advantageous Effects of Invention

According to an aspect of the present technology, it is possible to suppress the reflection of incident light with a wide wavelength band.

MODE(S) FOR CARRYING OUT THE INVENTION

First Embodiment

<Configuration Example of Embodiment of Solid-State Imaging Sensor to which the Present Technology is Applied>

Figure 1:
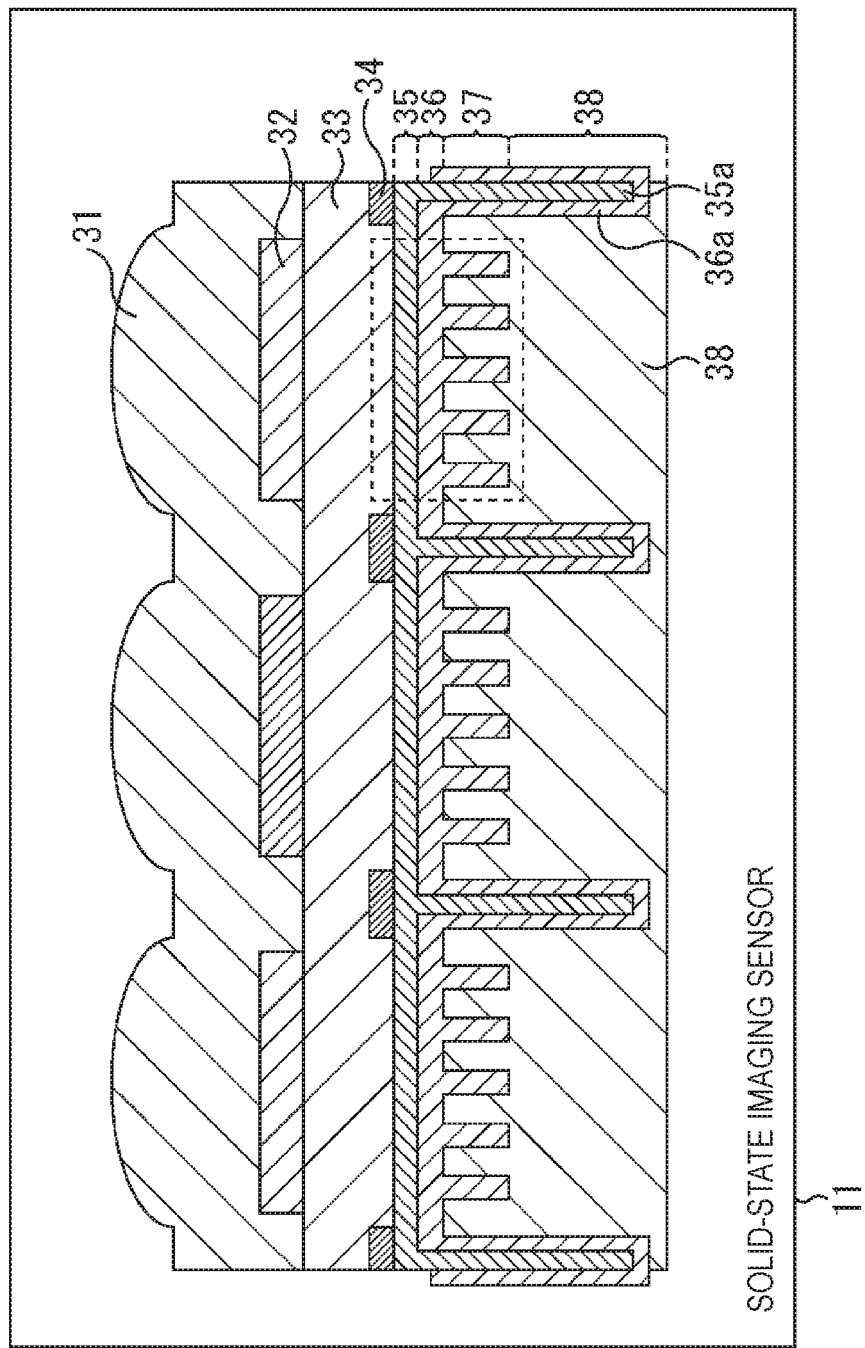
FIG. 1 is a diagram illustrating a configuration example of a first embodiment of a solid-state imaging sensor to which the present technology is applied.

FIG. 1 is a sectional side view illustrating a configuration example of an embodiment of a solid-state imaging sensor to which the present technology is applied.

A solid-state imaging sensor 11 in FIG. 1 includes, from the top in the diagram, a lens 31, a color filter 32, a planarized film 33, a light shielding film 34, an oxidized film (SiO2) 35, an intermediate second layer 36, an intermediate first layer 37, and a Si substrate 38.

The solid-state imaging sensor 11 in FIG. 1 receives light incident from the top in the diagram to generate a pixel signal corresponding to the amount of received light.

More specifically, the lens 31 collects incident light on a photoelectric conversion element (not shown) provided per pixel unit in the Si substrate 38. Note that, in the diagram, a convex portion toward the top in the diagram in the lens 31 corresponds to each pixel. In FIG. 1, three pixels are arranged in the horizontal direction as an example.

The color filter 32 is a filter through which only light with a specific wavelength is transmitted of the incident light, for example, extracts light with a wavelength corresponding to any of RGB (red, green, blue), and allows the light to be transmitted through a post-stage configuration.

The planarized film 33 allows the color filter 32 and the oxidized film 35 to be adhered and connected to each other.

The light shielding film 34 includes a metallic film, such as W (tungsten), for example, to shield the incident light onto an adjacent pixel and prevent the crosstalk of the incident light between pixels.

The oxidized film 35 electrically isolates between adjacent pixels to prevent the crosstalk of a pixel signal between the adjacent pixels. In particular, a boundary portion 35a including the same material as that of the oxidized film 35 provided to a trench provided in the boundary between the respective pixels is formed to prevent the leakage of the pixel signal to pixels adjacent in the horizontal direction. Note that, the lens 31, the color filter 32, the planarized film 33, the light shielding film 34, and the oxidized film 35 are generically referred to as environmental media or environmental medium layers, for the subsequent configuration.

The two layers of the intermediate first layer 37 and the intermediate second layer 36 form an intermediate layer having a pseudo high-refracting layer, and function as reflectance adjusting layers for suppressing the reflection on the Si substrate 38. Herein, the intermediate second layer 36 includes a boundary portion 36a which has the same material as that of the oxidized film 35 and surrounds the boundary portion 35a provided at the boundary per pixel unit. The respective pixels are electrically isolated by the boundary portion 35a and the crosstalk of the pixel signal between adjacent pixels is suppressed.

Figure 2:
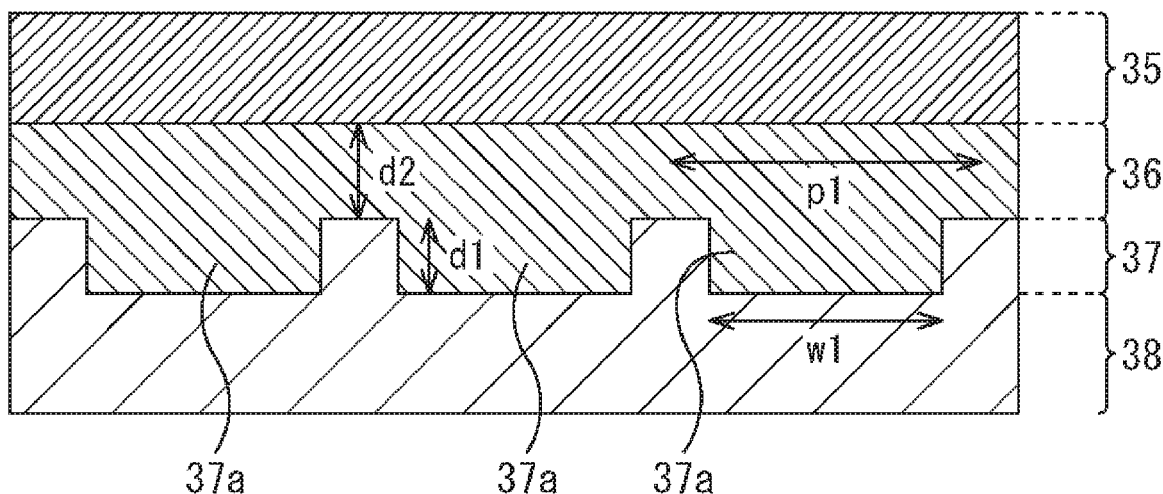
FIG. 2 is a diagram illustrating a configuration for reducing the reflection from a Si substrate in the solid-state imaging sensor in FIG. 1.

More specifically, the reflectance adjusting layer with a structure for suppressing the reflection of the incident light shown within a range surrounded by a dotted line in FIG. 1 has a configuration illustrated in FIG. 2.

FIG. 2 is a diagram illustrating the configuration of the reflectance adjusting layer surrounded by a dotted line part in the solid-state imaging sensor 11 in FIG. 1 to suppress the reflection of the incident light. In FIG. 2, from the top, the oxidized film 35, the intermediate second layer 36, the intermediate first layer 37, and the Si substrate 38 are provided. Among those, the intermediate second layer 36 and the intermediate first layer 37 function as reflectance adjusting layers.

The intermediate second layer 36 is formed of a material, for example, SiN, HfO2, Ta2O5, Nb2O5, and TiO2 with a refractive index n2 ranging from 1.9 to 2.3.

Figure 3:
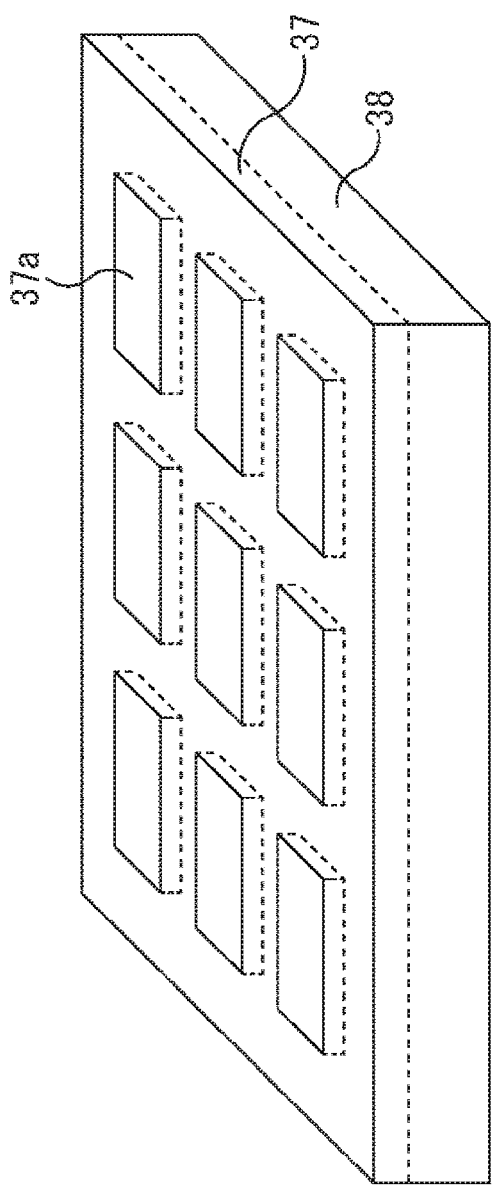
FIG. 3 is a perspective view illustrating the configuration in FIG. 2.

Further, the intermediate first layer 37 is configured by mixedly arranging, for example, a material forming the intermediate second layer 36 and a material Si forming the Si substrate 38. More specifically, as illustrated in FIG. 3, a concavo-convex structure is formed on the Si substrate 38. The material forming the intermediate second layer 36 is filled into a concave portion 37a of the structure. Note that, in FIG. 3, a material forming the intermediate second layer 36 is filled into the concave portion 37a, thereby forming a prismatic shape to be provided in the concave portion 37a in the concavo-convex structure on the Si substrate 38. Herein, the structure formed in the concave portion 37a is not limited to the prismatic shape, but may be another shape, for example, cylinder shape. Further, the intermediate first layer 37 has a height d1 of the concave portion 37a within a range of approximately 20 to 60 nm, and is configured by mixedly arranging a material forming the Si substrate 38 and a material forming the intermediate second layer 36 with a volume ratio thereof as a predetermined value. Consequently, a refractive index n1 of the intermediate first layer 37 is 2.6 to 3.7 as a whole.

More specifically, the intermediate first layer 37 ideally includes a material with an extinction coefficient as 0 and a refractive index ranging from 2.6 to 3.7. However, there is not actually the material with the extinction coefficient as 0 and the refractive index ranging from 2.6 to 3.7. Therefore, the intermediate first layer 37 is formed by mixedly arranging a material forming the Si substrate 38 with a refractive index ns=4.1 and a refractive index adjusting material (herein, the same material as that forming the intermediate second layer 36) with the refractive index n2 ranging from 1.9 to 2.3 lower than the refractive index of the Si substrate with a volume ratio thereof. As a whole, the refractive index is averaged and the refractive index n1 ranges from 2.6 to 3.7.

For example, in a case where a volume V1 of the concave portion 37a forming the intermediate first layer 37 and a volume V2 with the same range as that of the material of the Si substrate 38 (convex portion to the concave portion 37a) satisfy a relation of V1:V2=3:2, when the refractive index ns of the material Si of the Si substrate 38 is 4.1 and a material forming the intermediate second layer 36 is Ta2O5 with the refractive index n2 as 2.2, the intermediate first layer 37 is formed with the refractive index n1 as approximately 3.3 that is averaged by mixed arrangement corresponding to the volume ratio thereof.

However, when a refractive index ni of the oxidized film 35 containing SiO2 is 1.46 and the refractive index ns of the Si substrate 38 is 4.1, if the refractive index ni<refractive index n2<refractive index n1<refractive index ns is satisfied, the intermediate first layer 37 and the intermediate second layer 36 may be formed of a material with another refractive index. Note that, for the Si substrate 38, a substrate containing InGaAs with the refractive index as approximately 4.0 can be similarly used.

<Manufacturing Method>

Figure 4:
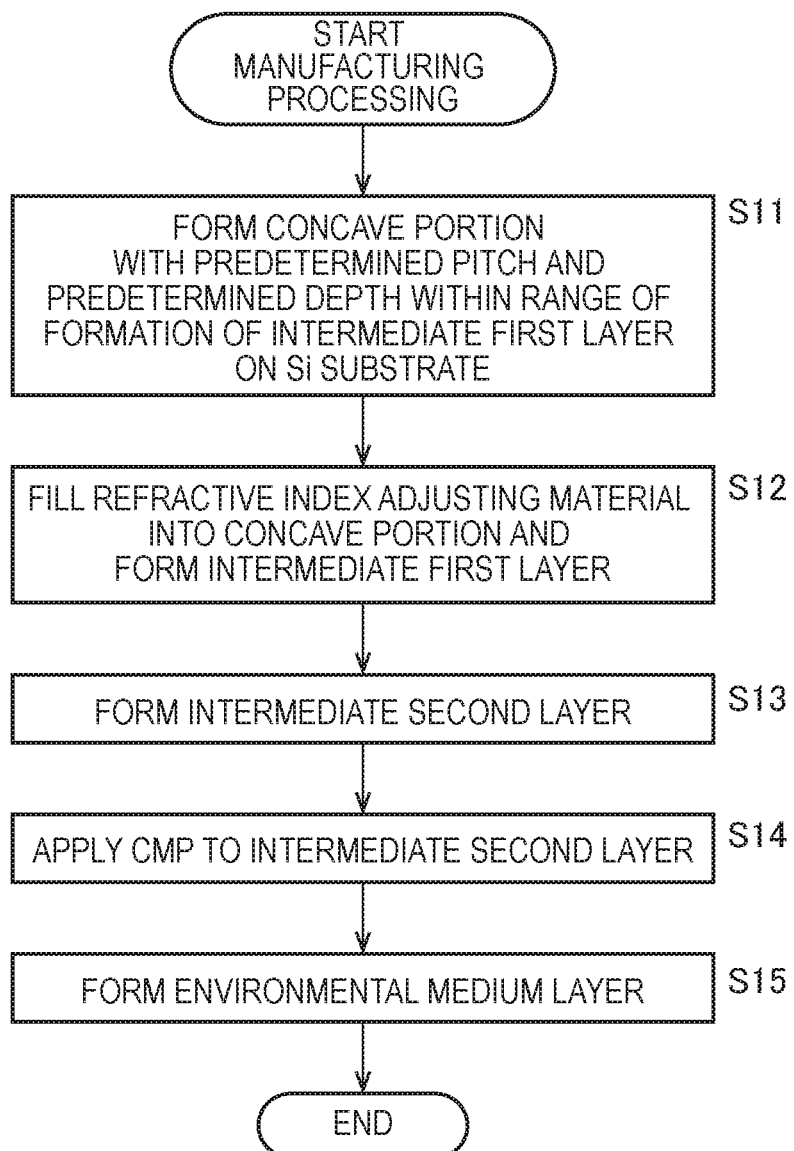
FIG. 4 is a flowchart illustrating a manufacturing method of the configuration in FIG. 2 of the solid-state imaging sensor in FIG. 1.

Next, a description will be given of a manufacturing method of a reflectance adjusting layer including the oxidized film 35, the intermediate second layer 36, the intermediate first layer 37, and the Si substrate 38, and having a structure surrounded by the dotted line in FIG. 1 for reducing the reflectance, with reference to a flowchart of FIG. 4.

In step S11, within a range of formation of the intermediate first layer 37 on the Si substrate 38 including a photoelectric conversion element (not shown), for example, with photolithography, the concave portion 37a is formed with a predetermined pitch p1, a width w1, and a height (depth) d1. Herein, the concave portion 37a illustrated in FIGS. 2 and 3 has a prismatic shaped configuration with, for example, the height (depth) d1 of 31 nm, width w1 of 57 nm, and pitch p1 of 90 nm. Therefore, a convex portion on which Si of the Si substrate 38 remains has the width of 33 nm. A volume ratio of V1 to V2 is, for example, 3:2 where the volume V1 is formed of Si forming the Si substrate 38 and the volume V2 is a volume of the concave portion 37a with the configuration.

Note that the pitch is preferably the wavelength or less of the adjacent intermediate second layer 36. Therefore, for example, when the shortest wavelength is 400 nm and the refractive index of the intermediate second layer 36 is 2.2, the pitch p1 is preferably a wavelength $\lambda 2$ (=182 nm=400/2.2) or less in the intermediate second layer 36. Further, the height d1 of the concave portion 37a has an ideal condition ($n1 \times d1 = \lambda/4$) that 2×refractive index (n1)×height (d1) is a half wavelength ($\lambda/2$) in the reciprocating light path of the light in the thin film with interference of the thin film. However, since there is a degree of freedom for adjusting the refractive index and the height to the intermediate second layer 36, the condition may be within a range of $n1 \times d1 < 3\lambda/8$. That is, the height d1 is 31 nm, smaller than 62.5 (=3×550/8/3.3) nm.

In step S12, the intermediate first layer 37 is formed by filling the refractive index adjusting material into the concave portion 37a. In the example in FIG. 2, the refractive index adjusting material has the same material as that of the intermediate second layer 36. For example, when the incident light is light of 550 nm, the intermediate first layer 37 is formed by filling Ta2O5 with the refractive index n2 as 2.2.

In step S13, the intermediate second layer 36 is formed. That is, in FIG. 2, when the same incident light as that of the refractive index adjusting material is light of 550 nm, the film is formed with lamination so that the height d2 of Nb2O5 with the refractive index n2 as 2.2 is 54 nm.

In step S14, chemical mechanical polishing (CMP) is applied to the top surface of the intermediate second layer 36, thereby flattening the unevenness corresponding to the unevenness on the top surface of the intermediate first layer 37. For example, in FIG. 2, the height d2 of the intermediate second layer 36 is set to 54 nm. That is, the height d2 of the intermediate second layer 36 has an ideal condition ($n2 \times d2 = \lambda/4$) that 2×refractive index (n2)×height (d2) is a half wavelength ($\lambda/2$) in the reciprocating light path of the light in the thin film with interference of the thin film. However, there is a degree of freedom for adjusting the refractive index and height to the intermediate first layer 37, the condition may be within a range of $n2 \times d2 < 3\lambda/8$. That is, the height d2 is 54 nm smaller than 93.8 (=3×550/8/2.2) nm.

Note that, the flattening may be used. Therefore, the processing may be processing except for the CMP, for example, the flattening may be performed by using etching. Further, since effects can be obtained although the improvement effect deteriorates in the case of omitting CMP, CMP may be omitted.

In step S15, the oxidized film 35 containing SiO2 is formed and, subsequently, the components including the oxidized film 35 and above in FIG. 1 are formed as an environmental medium layer.

With the configuration manufactured by the processing, for example, in FIG. 2, in the intermediate first layer 37 as a whole, the refractive index n1 is 3.3, and it is possible to suppress the reflection from the Si substrate 38 as a whole.

Herein, conditions with the above processing are marshaled.

The refractive index n1 is expressed by the following Formula (1) using the refractive index ns of Si in the Si substrate 38 and the refractive index n2 of the refractive index adjusting material with the same material in the intermediate second layer 36.

$$n1 = ns \times rs + r2 \times n2 \quad (1)$$

In Formula (1), rs and r2 denote weight coefficients obtained by a ratio of volume V1 made of Si forming the Si substrate 38 in the intermediate first layer 37 to volume V2 of the concave portion 37a, V1:V2=rs:r2 and rs+r2=1 are obtained.

When a wavelength of transmitted light is $\lambda$, a relation between height (depth) d1 of the intermediate first layer 37 and the refractive index n1 of the intermediate first layer 37 is generalized and expressed by the following Formula (2).

$$n1 \times d1 < 3\lambda/8 \quad (2)$$

Herein, the basis of Formula (2) is obtained from a relation between the wavelength and the difference in reciprocating light path with the interference of the thin film. However, a condition for reducing the reflectance most in the interference of the thin film is set when a relation is established with an offset of a half-wavelength phase represented by the following Formula (3).

$$n1 \times d1 = \lambda/4 \quad (3)$$

However, also in the intermediate second layer 36, the similar interference operation can be expected. Therefore, it is when the relation of Formula (2) described above is satisfied in consideration of the degree of freedom caused by combination with the refractive index n2 and height d2 of the intermediate second layer 36.

Similarly, when a wavelength of transmitted light is $\lambda$, a relation between the height d2 and the refractive index n2 of the intermediate second layer 36 is generalized and expressed by the following Formula (4).

$$n2 \times d2 < 3\lambda/8 \quad (4)$$

Also here, the basis of Formula (4) is obtained from a relation between the wavelength and the difference in reciprocating light path with the interference of the thin film. However, a condition for reducing the reflectance most in the interference of the thin film is set when a relation is established with an offset of a half-wavelength phase represented in the following Formula (5).

$$n2 \times d2 = \lambda/4 \quad (5)$$

However, also in the intermediate first layer 37, the similar interference operation can be expected. Therefore, it is when the relation of Formula (4) is satisfied in consideration of the degree of freedom caused by combination with the refractive index n1 and height d1 of the intermediate first layer 37.

That is, to summarize the above conditions, as a first condition, when the refractive indexes of the Si substrate 38, the intermediate first layer 37, the intermediate second layer 36, and the oxidized film 35 are ns, n1, n2, and ni, respectively, the following Formula (6) is satisfied, and the conditions of Formula (2) and Formula (4) described above are satisfied, it is possible to reduce the reflection of incident light transmitted via the lens 31 and the color filter 32 on the Si substrate 38 by using the principle of the interference of the thin film.

$$ns > n1 > n2 > ni \quad (6)$$

Herein, the mechanism for reducing the reflection on the Si substrate 38 is not a mechanism for reducing the reflection with stepwise refraction using the thickness like the moth eye, but a mechanism for reducing the reflectance by applying the operation of the interference of the thin film with a plurality of films. Therefore, a thinner configuration than that of the moth eye enables the reduction of the reflection from the Si substrate 38.

Figure 5:
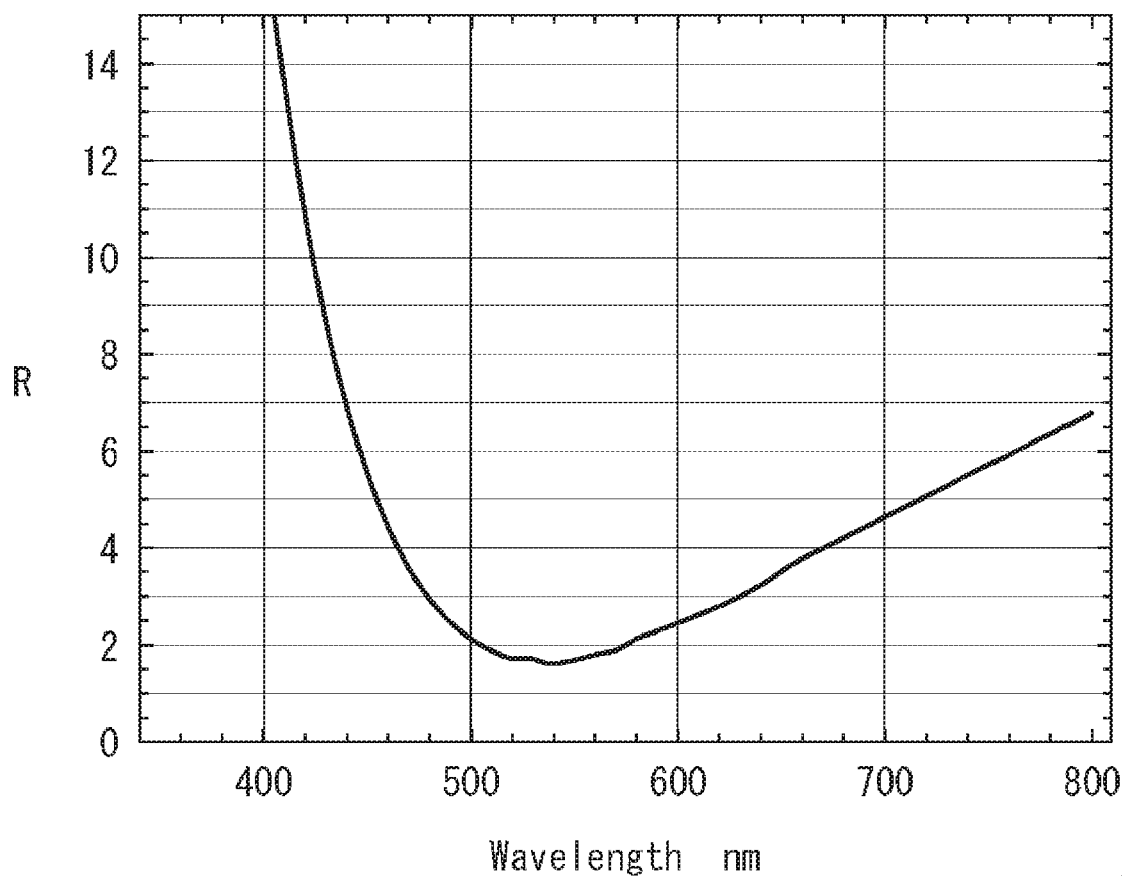
FIG. 5 is a diagram illustrating a conventional relation between a wavelength of incident light and the reflectance.

Further, normally, in the case of using only the thin film with the refractive index of 1.9 to 2.4 to which incident light with a central wavelength of 550 nm is assumed, as illustrated in FIG. 5, when the reflectance is measured with replacement of the wavelength of the incident light, the reflectance is approximately 1.5 in the case of light with a peripheral wavelength of 550 nm as the central wavelength. However, in the case of incident light with a wavelength band other than the central wavelength, the reflectance has a value exceeding 2 as a whole.

Figure 6:
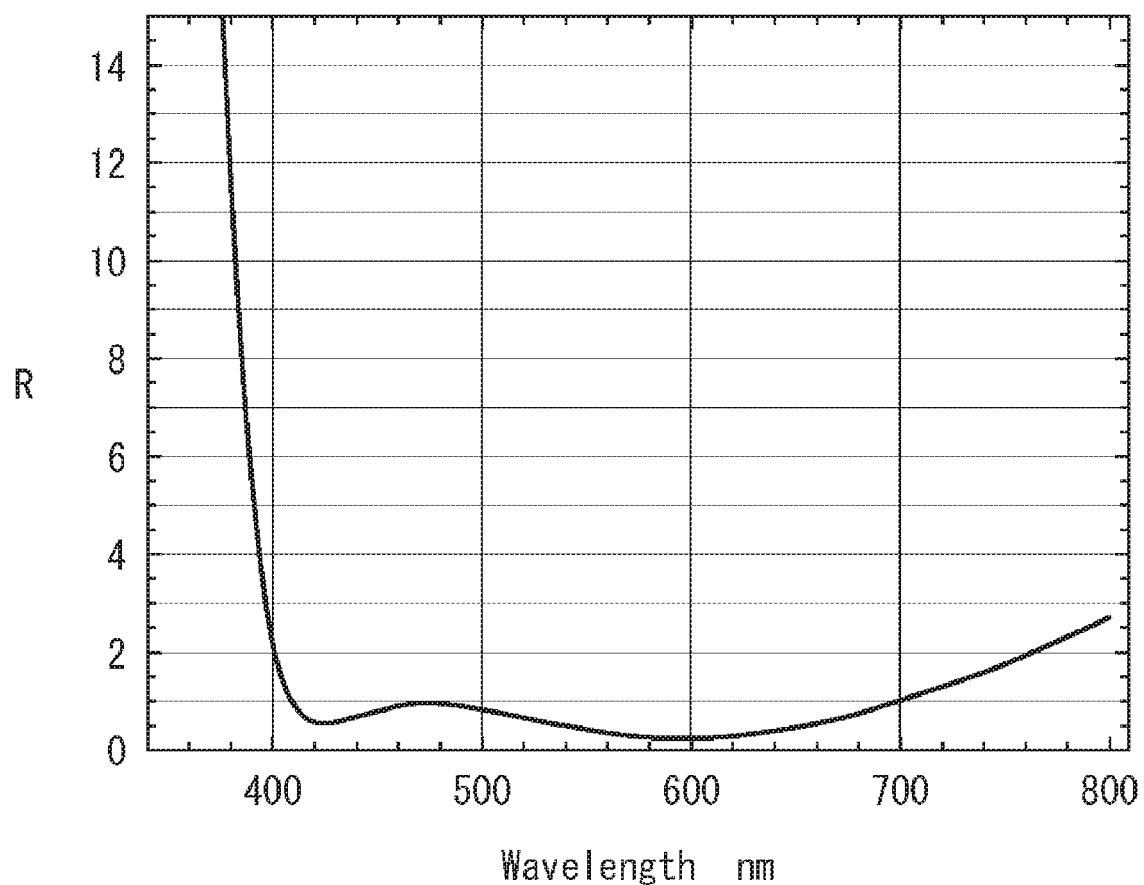
FIG. 6 is a diagram illustrating a relation between the wavelength of incident light and the reflectance when the configuration in FIG. 2 is used.

However, with the solid-state imaging sensor, as illustrated in FIG. 6 to which the present technology is applied, the reflectance can be set to approximately 1 as a whole with a wide wavelength band of 400 nm to 700 nm. It is possible to reduce the reflectance of the incident light with a wide wavelength band.

As a result, it is possible to suppress the reflection on the Si substrate 38 of the solid-state imaging sensor 11. Further, it is possible to suppress the reduction of the sensitivity in the photoelectric conversion element, and the light is not incident on adjacent pixels. Therefore, flare and ghosts can be reduced. Further, unlike the moth eye, with the configuration obtained by applying the effect of the interference of the thin film, the reflection on the Si substrate 38 can be suppressed. Therefore, it is possible to realize a reflectance adjusting layer that suppresses the reflection with a thinner configuration than the configuration to suppress the reflection by using the moth eye, for example, a configuration thinner than 100 nm.

Note that, with the configuration of the concave portion 37, it is possible to substantially ignore the influence from a taper (change of up to an area ratio of approximately 0.2), smooth bases at top and bottom ends of the unevenness, and roughness.

Further, in the processing in step S11, the example of using photolithography is described when the concave portion 37a is provided, but as long as the volume ratio is realized, another method may be used. For example, by using directed self assembly (DSA), the volume of Si as a material of the Si substrate 38 and the volume of the concave portion 37a have the volume ratio. With etching, the concave portion 37a may be formed.

Furthermore, even in the case where a layer with a refractive index nia and a height dia is formed between any layers and a relation of nia×dia<$\lambda$/2 is satisfied, if the difference in refractive index between adjacent layers is approximately 10 percent, the influence is small. Therefore, the configuration may be considered as that included in continuous layers.

Further, when a layer with the refractive index nia and the height dia is formed between any layers and ni2×di2<$\lambda$/10 is satisfied, the thickness of the inserted layer is considered to be extremely thin. Therefore, it is assumed that there is not the influence from the interference, and the layer may be ignored. For example, even if there is a high-refractive-index layer of approximately n=2.2 containing Nb2O5 or the like, the height as the film thickness is sufficiently thin, such as 5 nm, the influence may be ignored. Further, even if there is a plurality of layers under the above-described conditions, the layer can be similarly handled.

Second Embodiment

In the foregoing, the example has been given of using the same material as that used in the intermediate second layer 36 as the refractive index adjusting material filled into the concave portion 37a in the intermediate first layer 37. As mentioned above, if the conditions in Formula (2), Formula (4), and Formula (6) described above are satisfied, the refractive index adjusting material may be different from the material used in the intermediate second layer 36.

Figure 7:
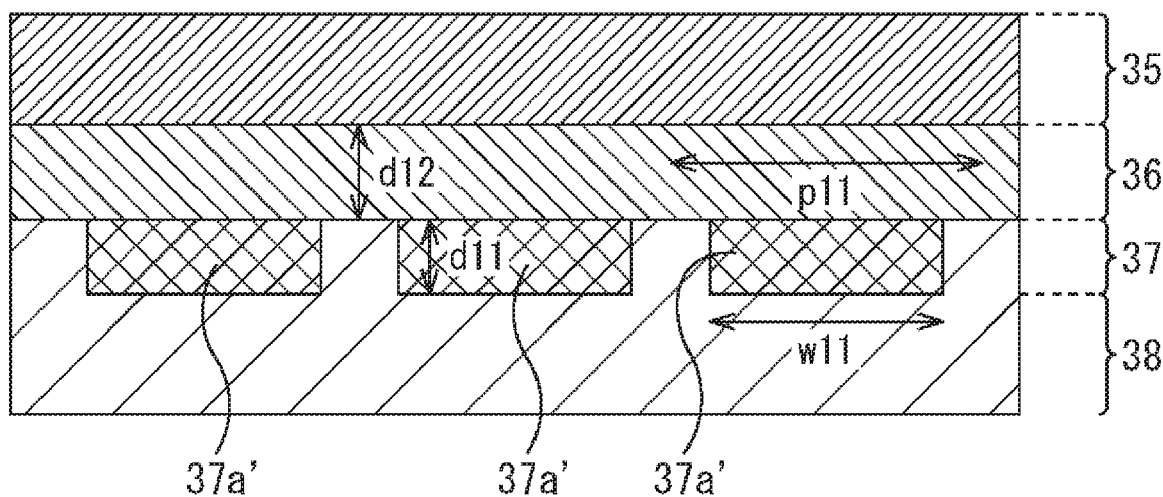
FIG. 7 is a diagram illustrating a configuration example of a second embodiment of a solid-state imaging sensor to which the present technology is applied.

That is, for example, as illustrated in FIG. 7, the Al2O3 with the refractive index of 1.6 may be filled into a cylindrical-shaped concave portion 37a' corresponding to the concave portion 37a.

In this case, the volume ratio of Si to Al2O3 in the intermediate first layer 37 is 67:33. Therefore, both weight coefficients rs and rAl2O3 are 0.67 and 0.33, respectively.

As a consequence thereof, the height d12 of the intermediate first layer 37 is, e.g., 31 nm, the height d11 of the intermediate second layer 36 is, e.g., 54 nm, the pitch p11 of the cylindrical-shaped concave portion 37a' is, e.g., 90 nm, and the width (diameter) w12 of the cylindrical-shaped concave portion 37a' is, e.g., 59 nm.

Thus, the intermediate first layer 37 having the concave portion 37a' into which Al2O3 is filled is formed on the Si substrate 38. Note that, if the refractive index n1 and height d1 of the intermediate first layer 37 have thickness of n1×d1<$\lambda$/10 or less, it is assumed that there is substantially not the influence from the interference. Therefore, the polishing is not necessarily required with the CMP till the convex portion is exposed from the Si substrate 38 in the intermediate first layer 37, and Al2O3 filled into the concave portion 37' may remain with approximately 10 nm.

Further, as the refractive index adjusting material filled into the concave portion 37a in the intermediate first layer 37, as long as the conditions in Formula (2), Formula (4), and Formula (6) described above are satisfied, another material may be used, for example, an oxidized film or a nitride film including at least one kind of Hf, Al, Ti, Zr, Ta, Nb, Y, and Sr, for example, ZrO2.

With the configuration, the similar effect to that of the configuration in FIG. 2 can be obtained.

Further, by using a material with a high dielectric constant called a high-k material, such as Al2O3 to the top of the Si substrate 38, the protection by dry etching is possible from a damage when processing the Si substrate 38. Further, it is possible to protect an interface state by a film containing Al2O3 or the like having fixed charges.

Third Embodiment

In the foregoing, the description has been given of the example in which the intermediate first layer 37 includes 1 layer, but the intermediate first layer 37 may include a plurality of layers.

Figure 8:
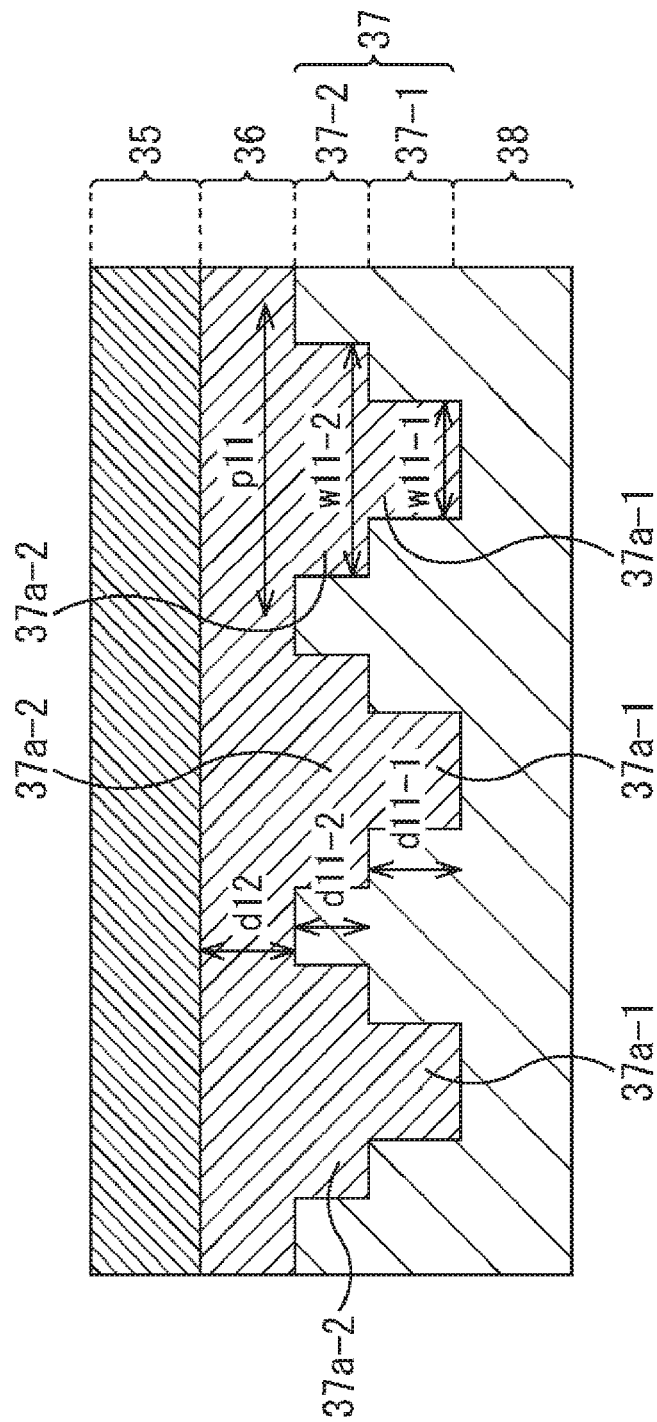
FIG. 8 is a diagram illustrating a configuration example of a third embodiment of a solid-state imaging sensor to which the present technology is applied.

That is, for example, as illustrated in FIG. 8, the intermediate first layer 37 may include 2 layers of intermediate first layers 37-1 and 37-2.

In FIG. 8, the intermediate first layer 37 includes 2 layers of the intermediate first layers 37-1 and 37-2. In the intermediate first layer 37-1, a concave portion 37a-1 has a pitch p11, a height d11-1, and a width w11-1. The intermediate first layer 37-2 includes the concave portion 37a-2 having the pitch p11, a height d11-2, and a width w11-2.

In this case, the condition is changed depending on the relation of the refractive indexes of the respective layers. First, when the refractive indexes of the intermediate first layers 37-1 and 37-2 are n11 and n12 respectively, the relation of the refractive indexes of the layers preferably satisfies the following relation in Formula (7), corresponding to the relation in Formula (6) described above.

$$ns > n11 > n12 > n2 > ni \qquad (7)$$

Further, the difference in refractive index between the intermediate first layers 37-1 and 37-2 is larger than a predetermined value (e.g., difference (ns–n11) between the refractive index of the Si substrate 38 and the refractive index of the intermediate first layer 37-1) (n11–n12>ns–n11), the effect of the interference is assumed to be large in the respective intermediate first layers 37-1 and 37-2. In each of the intermediate first layers 37-1 and 37-2, the relation in Formula (2) is satisfied.

On the other hand, when the difference in refractive index between the intermediate first layers 37-1 and 37-2 is smaller than a predetermined value (e.g., difference (ns–n11) between the refractive index of the Si substrate 38 and the refractive index of the intermediate first layer 37-1) (n11–n12<ns–n11), the effect of the interference is assumed to be small in the respective intermediate first layers 37-1 and 37-2. Therefore, the intermediate first layers 37-1 and 37-2 are assumed to be the same layer together, and the following relation in Formula (8) is satisfied.

$$n11 \times d11\text{-}1 + n12 \times d11\text{-}2 + \ldots < 3\lambda/8 \qquad (8)$$

Note that Formula (8) includes the case in which the intermediate first layer 37 includes 3 layers or more. In this case, the refractive index of the third layer or subsequent layer is n13, n14 . . . . Each height is d11-3, d11-4 . . . . In FIG. 8, the intermediate first layer 37 includes 2 layers, and Formula (8) is therefore expressed by "n11×d11-1+n12×d11-2<3λ/8".

As an example in which the difference in refractive index between the intermediate first layers 37-1 and 37-2 is larger than a predetermined value (n11–n12>ns–n11) and the condition in Formula (2) is satisfied, for example, if the refractive indexes of the intermediate first layers 37-1 and 37-2 are n11=3.7 and n12=3.1, respectively, d11-1=37 nm and d11-2=34 nm are obtained. When the refractive index adjusting material is Nb2O5 (refractive index 2.2), the concave portions 37a-1 and 37a-2 are structured to be quadratic-prism-shaped to satisfy the refractive indexes n11 and n12 of the intermediate first layers 37-1 and 37-2. The pitch p11 is 90 nm. Regarding the width, the width w11-1 is equal to 42 nm and the width w11-2 is equal to 65 nm, respectively.

Figure 9:
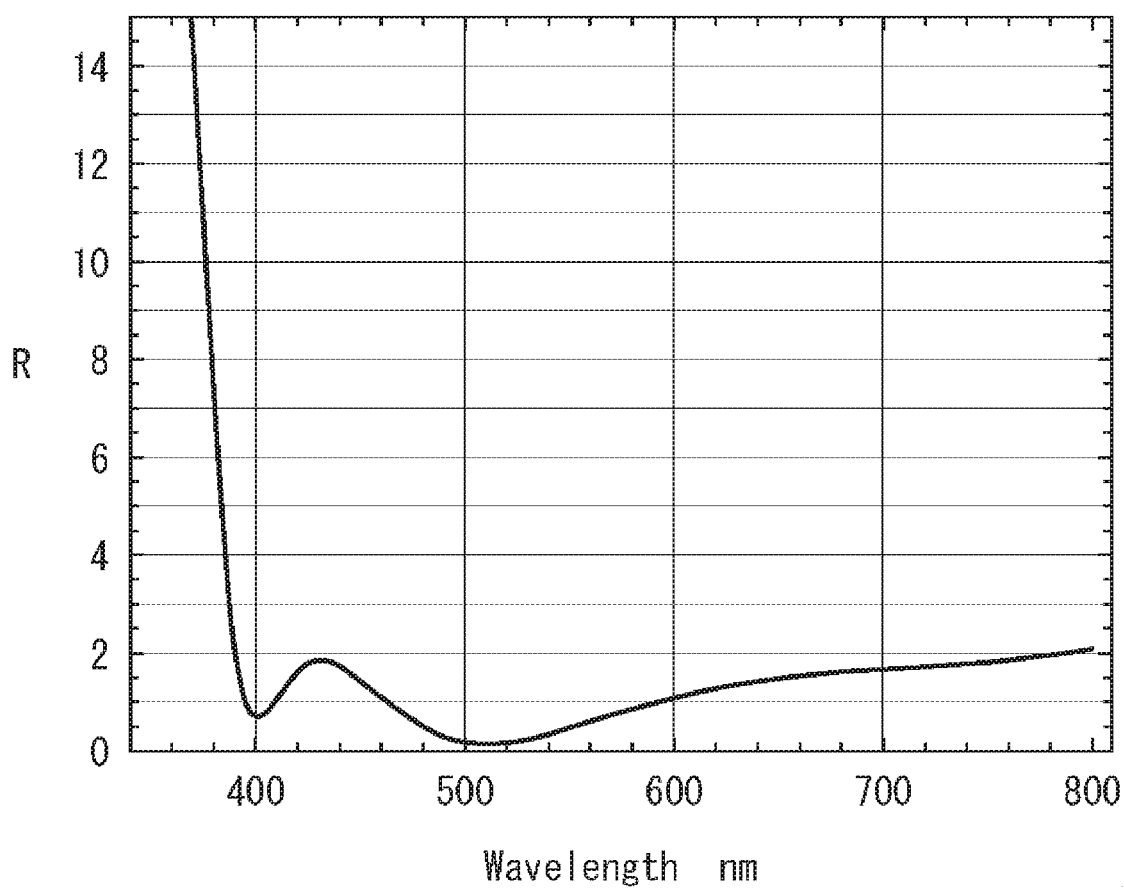
FIG. 9 is a diagram illustrating a relation between a wavelength of incident light and the reflectance when using a configuration for reducing the reflection from a Si substrate in the solid-state imaging sensor in FIG. 8.

With the configuration, for example, as illustrated in FIG. 9, the reflectance from the Si substrate 38 can be set to 2 or less at a wide wavelength band ranging from 400 nm to 800 nm of incident light. In particular, when the wavelength λ ranges from 500 to 520 nm, the reflectance can be set to approximately 0.

Fourth Embodiment

In the foregoing, the example has been given that the intermediate first layer 37 includes a plurality of layers. Similarly, the intermediate second layer 36 may include a plurality of layers.

Figure 10:
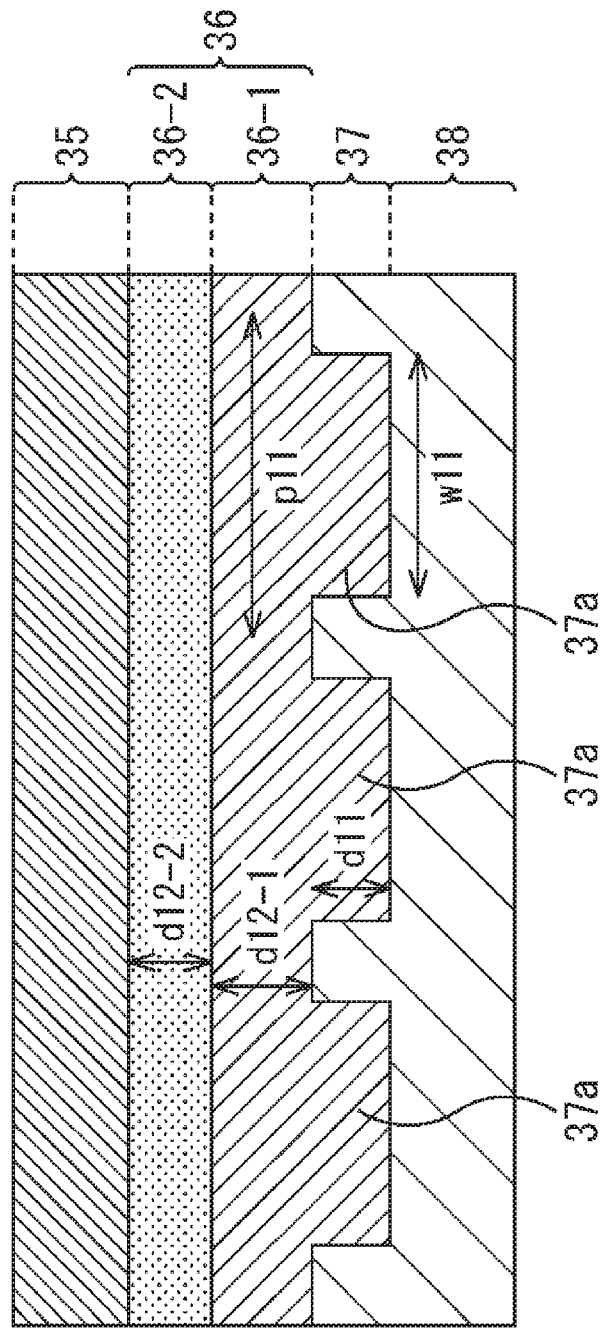
FIG. 10 is a diagram illustrating a configuration example of a fourth embodiment of a solid-state imaging sensor to which the present technology is applied.

That is, for example, as illustrated in FIG. 10, the intermediate second layer 36 may include 2 layers of intermediate second layers 36-1 and 36-2.

In FIG. 10, the intermediate second layer 36 includes 2 layers of the intermediate second layers 36-1 and 36-2, the intermediate second layer 36-1 contains, for example, Nb2O5 (refractive index 2.2) with a height d12-1, and the intermediate second layer 36-2 contains Ao2O3 (refractive index 1.65) with a height d12-2.

Note that, regarding the intermediate first layer 37, the concave portion 37a is formed with a height d11, a width d11, and a pitch p11.

In this case, the condition is changed depending on the relation of the refractive indexes between the layers. First, if the refractive indexes of the intermediate second layers 36-1 and 36-2 are n21 and n22, respectively, the relation of the refractive indexes between the respective layers preferably satisfies the following relation in Formula (9), corresponding to the relation in Formula (6) described above.

$$ns > n1 > n21 > n22 > ni \qquad (9)$$

Further, when the difference (n21–n22) in refractive index between the intermediate second layers 36-1 and 36-2 is larger than a predetermined value (e.g., difference (n22–ni) between the refractive index of the oxidized film 35 and the refractive index of the intermediate second layer 36-2) (n21–n22>n22–ni), the effect of the interference is assume to be large in the respective intermediate second layers 36-1 and 36-2. Therefore, the relation of Formula (4) is satisfied in the respective intermediate second layers 36-1 and 36-2.

On the other hand, when the difference (n21–n22) in refractive index between the intermediate second layers 36-1 and 36-2 is smaller than a predetermined value (e.g., difference (n22–ni) between the refractive index of the oxidized film 35 and the refractive index of the intermediate second layer 36-2) (n21–n22<n22–ni), the effect of the interference is assumed to be small in the respective intermediate second layers 36-1 and 36-2. Therefore, the intermediate second layers 36-1 and 36-2 are assumed to be the same layer together, the following relation of Formula (10) is satisfied.

$$n21 \times d12\text{-}1 + n22 \times d12\text{-}2 + \ldots < 3\lambda/8 \qquad (10)$$

Note that Formula (10) includes a case where the intermediate second layer 36 includes 3 layers or more. In this case, the refractive index of the third layer or subsequent layer is n23, n24 . . . . Each height is d12-3 and d12-4 . . . . In FIG. 10, an example of a configuration of 2 layers is represented. Therefore, Formula (10) is "n21×d12-1+n22×d12-2<3λ/8".

As an example in which the difference (n21–n22) in refractive index between the intermediate second layers 36-1 and 36-2 is larger than a predetermined value (n21–n22>n22–ni) and the condition of Formula (4) is satisfied, for example, when the refractive indexes of the intermediate second layers 36-1 and 36-2 are n21=2.2 and n22=1.65, respectively, the heights d12-1=58 nm and d12-2=55 nm are obtained. When the refractive index adjusting material is Nb2O5 (refractive index 2.2), the concave portion 37a is structured to be quadratic prism so as to satisfy the refractive index n11 of the intermediate first layer 37. The pitch p11 is 90 nm, the height d11 is 34 nm, and the width w11 is 57 nm.

Figure 11:
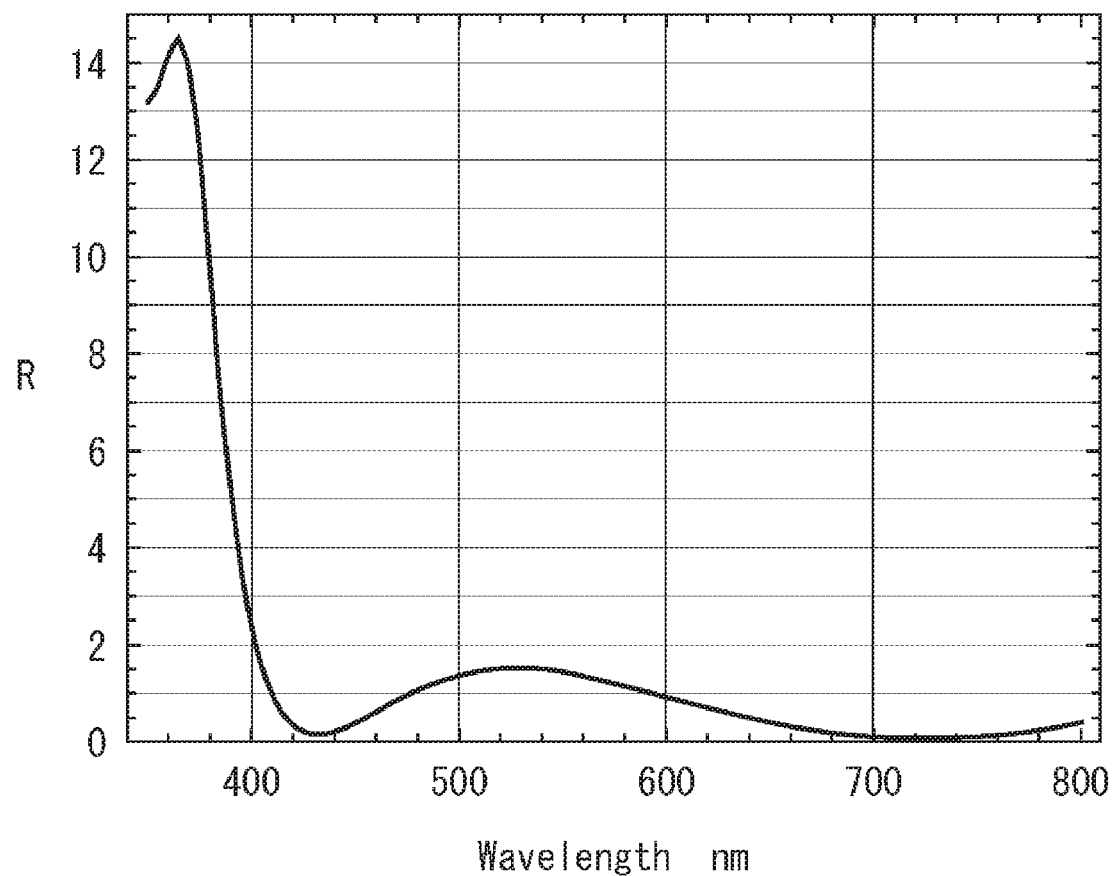
FIG. 11 is a diagram illustrating a relation between a wavelength of incident light and the reflectance when using the configuration for reducing the reflection from a Si substrate in the solid-state imaging sensor in FIG. 10.

With the configuration, for example, as illustrated in FIG. 11, at a wide wavelength band of 400 nm to 800 nm of the incident light, the reflectance from the Si substrate 38 can be set to 1.5 or less. In particular, at a wavelength λ of 430 nm and 700 nm, the reflectance can be set to approximately 0.

Fifth Embodiment

In the foregoing, as illustrated in FIG. 1, the description has been given of the example in which the crosstalk of the pixel signal between the adjacent pixels is reduced by forming the trench between the respective pixels and forming the boundary portion 35a having the same material (SiO2) as that of the oxidized film 35. Further, in place of the boundary portion 35a, as illustrated in FIG. 12, a boundary portion 34a having a metal, for example, W (tungsten) forming the light shielding film 34 may be formed.

Figure 12:
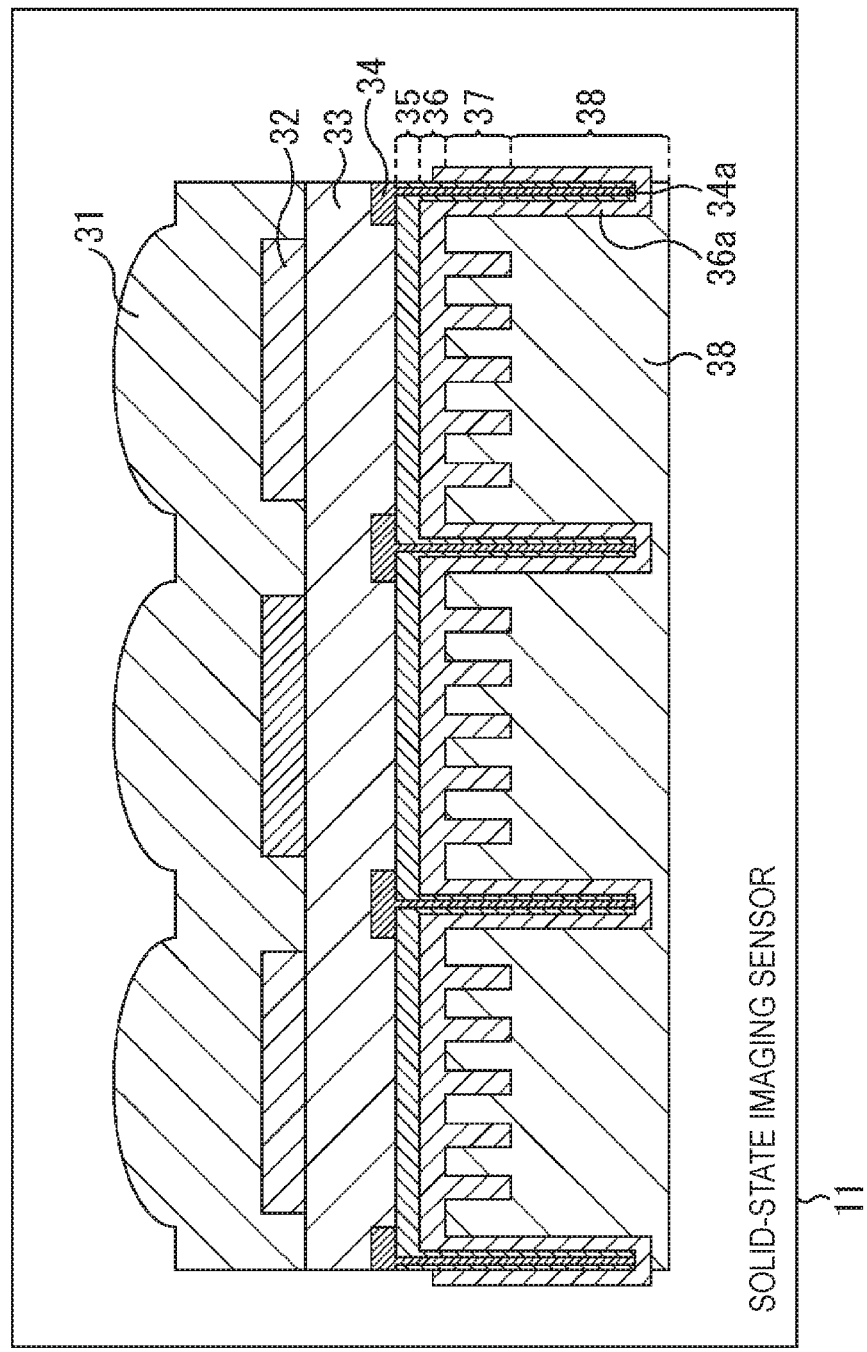
FIG. 12 is a diagram illustrating a configuration example of a fifth embodiment of a solid-state imaging sensor to which the present technology is applied.

Note that, in the solid-state imaging sensor 11 in FIG. 12, the same name and the same reference numeral are given to a configuration with the same function as that of the solid-state imaging sensor 11 in FIG. 1. A description thereof is omitted and is similar subsequently. The solid-state imaging sensor 11 in FIG. 12 is different from the solid-state imaging sensor 11 in FIG. 1 in that, in place of the boundary portion 35a, the boundary portion 34a containing a metal is provided to be connected to the light shielding film 34. Thus, not only electrical isolation but also light shielding between adjacent pixels is possible. Therefore, the crosstalk can be prevented with higher precision.

<First Modification of Fifth Embodiment>

In the foregoing, the description has been given of the example in which the boundary portion 34a is provided in a state of connection to the light shielding film 34. For example, the light shielding film 34 may not be provided but only the boundary portion 34a may be provided.

Figure 13:
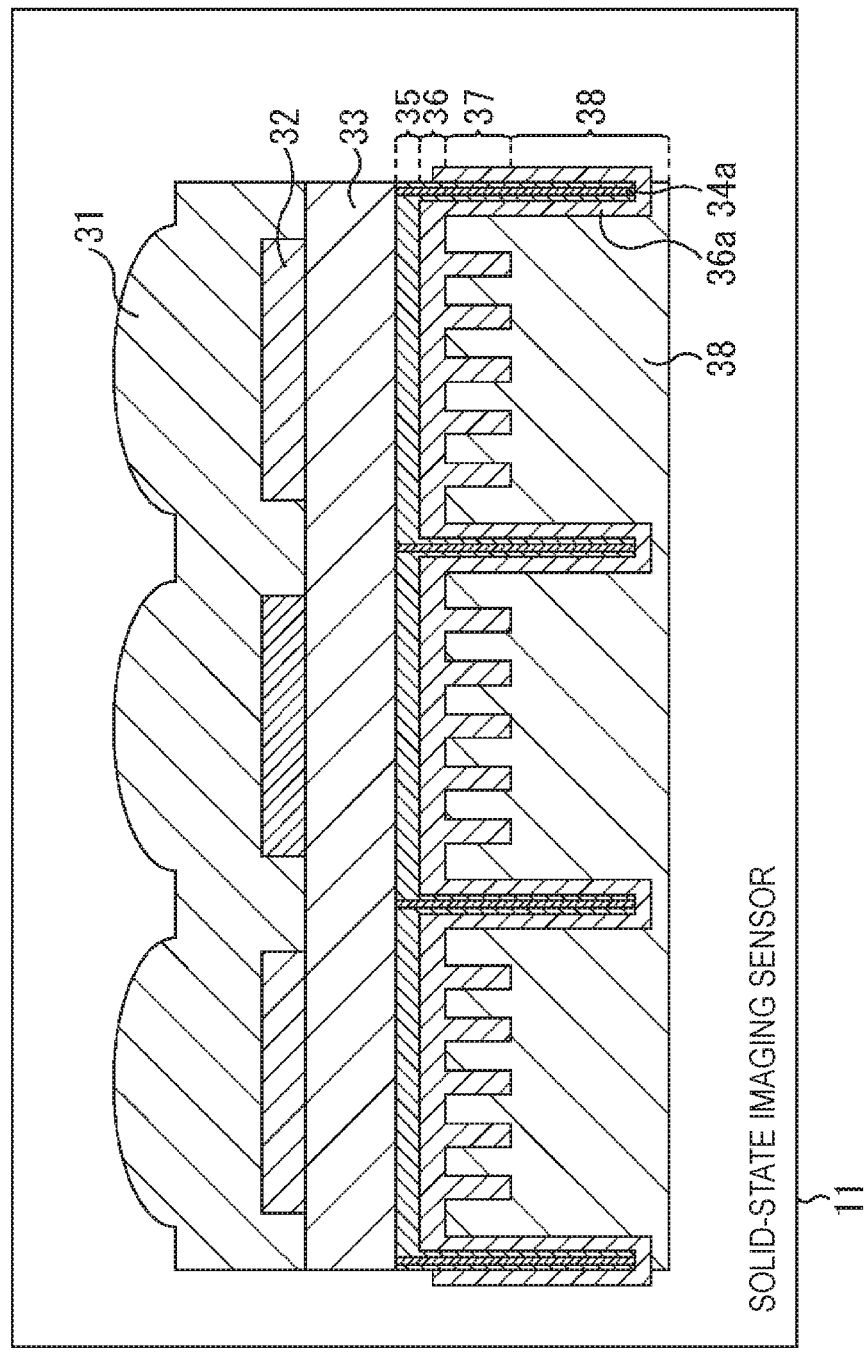
FIG. 13 is a diagram illustrating a first modification of the fifth embodiment of the solid-state imaging sensor to which the present technology is applied.

That is, as illustrated in the solid-state imaging sensor 11 in FIG. 13, the light shielding film 34 may not be provided but the boundary portion 34a may be provided.

With the configuration, the similar effect can be obtained by forming the boundary portion 34a even in a state in which the light shielding film 34 is not provided.

Sixth Embodiment

In the foregoing, the description has been given of the general pixel for imaging. Further, application may be performed to, e.g., an image-plane phase difference focus pixel (ZAF pixel) that a part of pixels is light-shielded.

Figure 14:
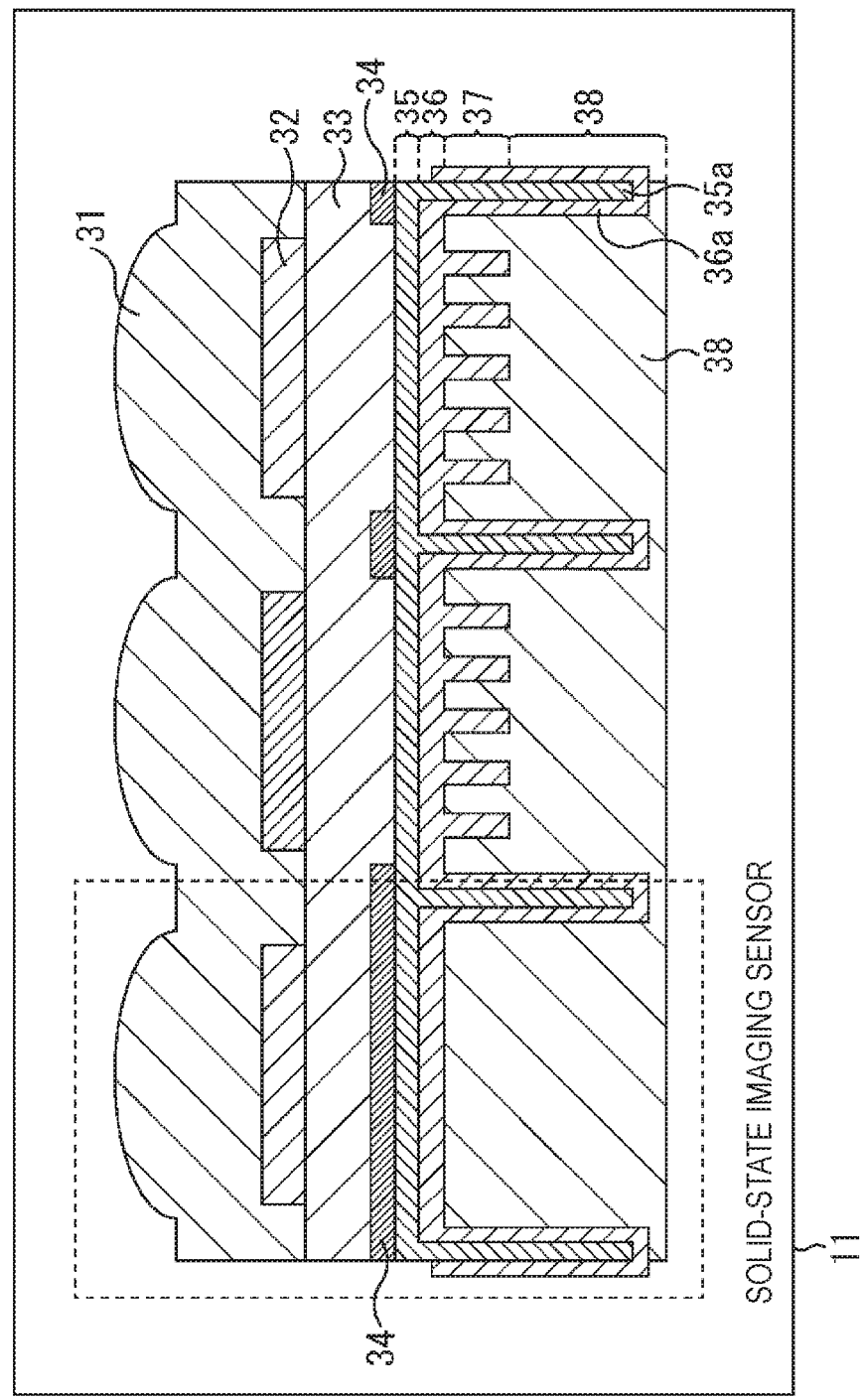
FIG. 14 is a diagram illustrating a configuration example of a sixth embodiment of a solid-state imaging sensor to which the present technology is applied.

That is, on a part of the top surface of the pixel at the left end in the diagram, set as a ZAF pixel surrounded by a dotted line portion in the solid-state imaging sensor 11 in FIG. 14, the light shielding film 34 is formed. The boundary portion 35a containing the similar material to that of the oxidized film 35 is also set by arranging a trench to the pixel with the unit basis of a pixel, thereby enabling suppression of not only the crosstalk between general pixels but also the crosstalk in the ZAF pixel. Note that, in the solid-state imaging sensor 11 in FIG. 14, a part of the ZAF pixel is light-shielded with the light shielding film 34. Therefore, the intermediate first layer 37 to reduce the reflection on the Si substrate 38 is not formed.

<First Modification of Sixth Embodiment>

In the foregoing, the description has been given of the example of arranging the boundary portion 35a containing the same material as that of the oxidized film 35 between pixels. Further, similarly to the solid-state imaging sensor 11 in FIG. 12, in place of the boundary portion 35a, the boundary portion 34a containing the same material as the metal forming the light shielding film 34 may be provided between pixels.

Figure 15:
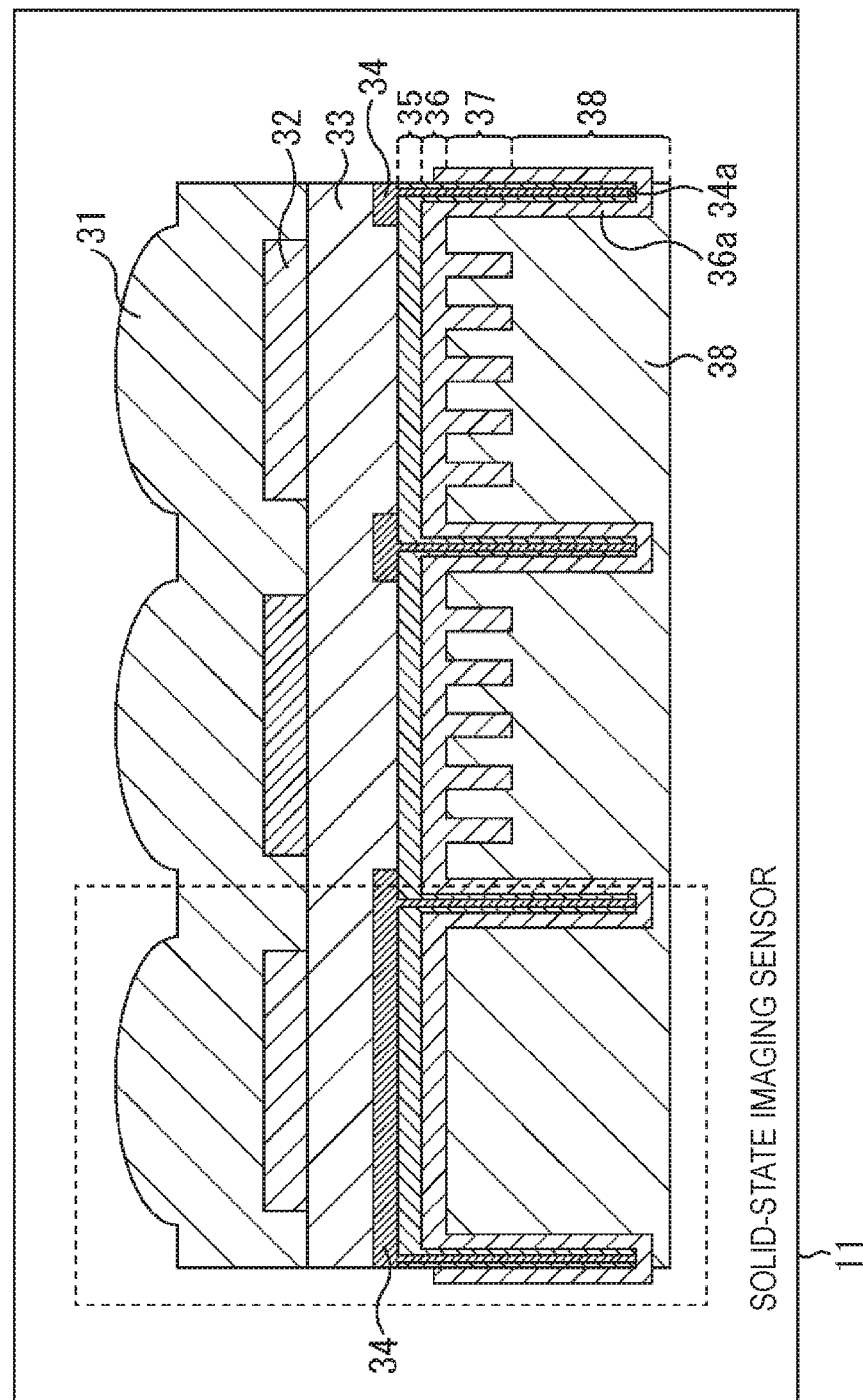
FIG. 15 is a diagram illustrating a first modification of the sixth embodiment of the solid-state imaging sensor to which the present technology is applied.

That is, as illustrated by the solid-state imaging sensor 11 in FIG. 15, in place of the boundary portion 35a, the boundary portion 34a containing the same material as the metal forming the light shielding film 34 is provided between pixels.

With the configuration, it is possible to suppress not only the crosstalk between the general pixels but also the crosstalk in the ZAF pixel with higher precision.

<Second Modification of Sixth Embodiment>

In the foregoing, the description has been given of the example of arranging the boundary portion 34a containing the same material as the metal forming the light shielding film 34 between pixels. Further, similar to the solid-state imaging sensor 11 in FIG. 13, the light shielding film 34 may not be provided, but only the boundary portion 34a may be provided.

Figure 16:
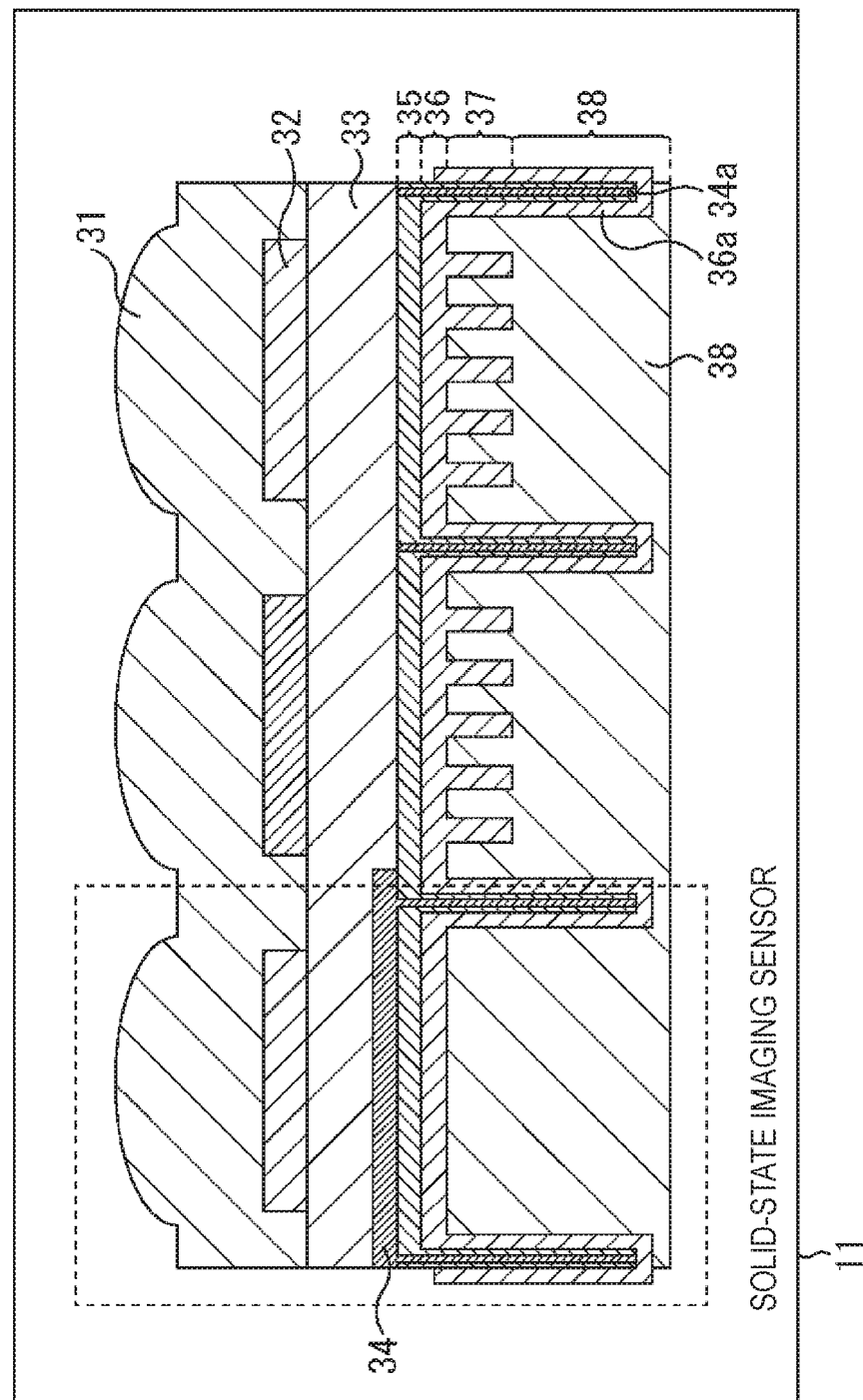
FIG. 16 is a diagram illustrating a second modification of the sixth embodiment of the solid-state imaging sensor to which the present technology is applied.

That is, as illustrated by the solid-state imaging sensor 11 in FIG. 16, the light shielding film 34 is not provided between pixels, but the boundary portion 34a containing the same material as the metal forming the light shielding film 34 is provided therebetween.

With the configuration, it is possible to suppress not only the crosstalk between the general pixels but also the crosstalk in the ZAF pixel with higher precision.

<Third Modification of Sixth Embodiment>

In the foregoing, the description has been given of the example in which the intermediate first layer 37 is not formed to the image-plane phase difference focus pixel (ZAF pixel). Further, the intermediate first layer 37 may be also provided to the ZAF pixel.

Figure 17:
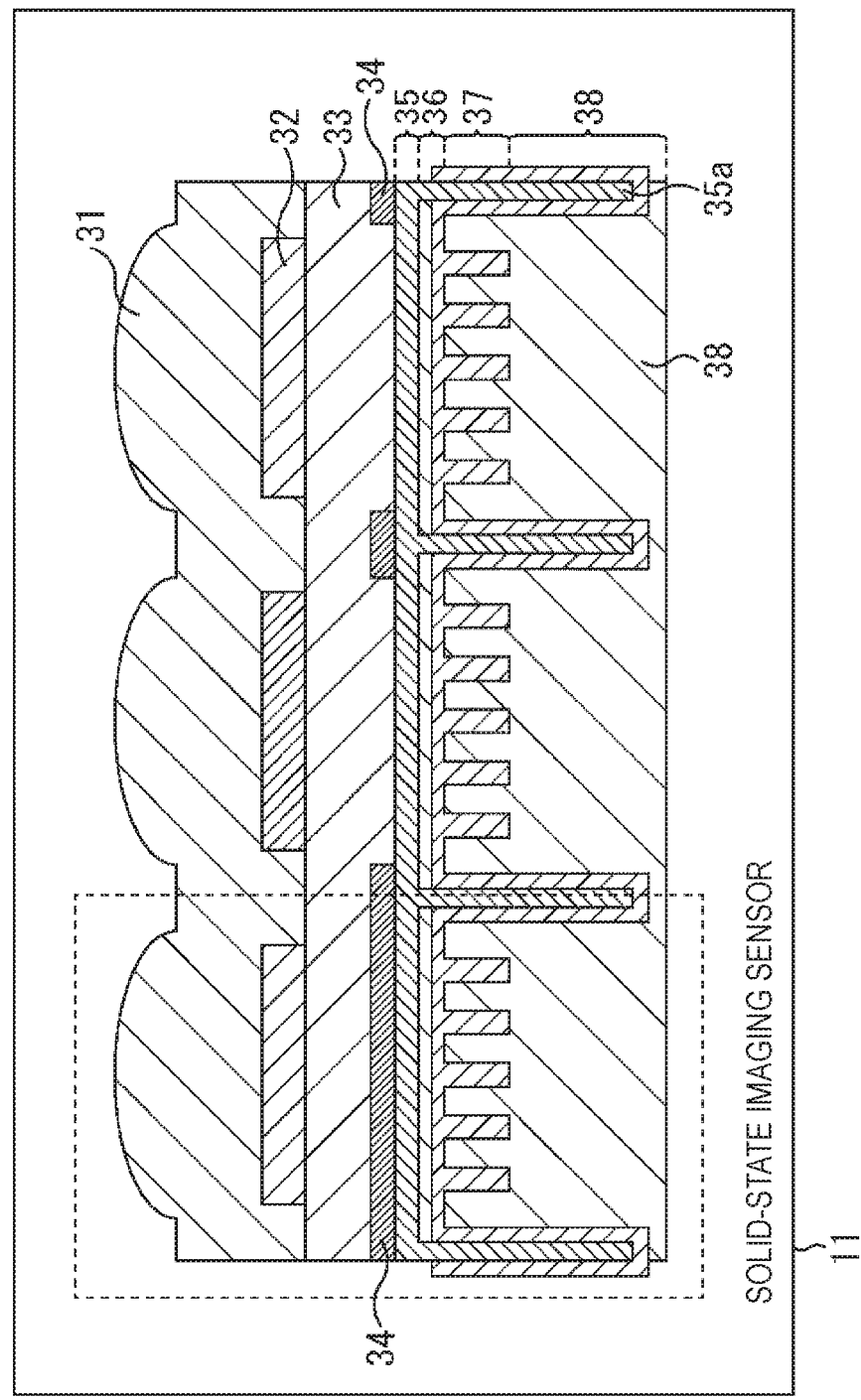
FIG. 17 is a diagram illustrating a third modification of the sixth embodiment of the solid-state imaging sensor to which the present technology is applied.

That is, as illustrated by the solid-state imaging sensor 11 in FIG. 17, the intermediate first layer 37 is also formed to a pixel at the left end in the diagram, set as the ZAF pixel. It is also possible to suppress the reflection light on the Si substrate 38 in the ZAF pixel with the configuration, and perform focusing at higher speed with higher precision. Note that, although not illustrated, also in the solid-state imaging sensor 11 in FIG. 17, in place of the boundary portion 35a, the boundary portion 34a may be provided. Further, the light shielding film 34 is omitted and only the boundary portion 34a may be provided.

<Examples of Application to Electronic Device>

The above-described solid-state imaging sensor can be applied to various electronic devices, for example, an imaging device such as a digital still camera and a digital video camera, a mobile phone having an imaging function, or other devices having an imaging function.

Figure 18:
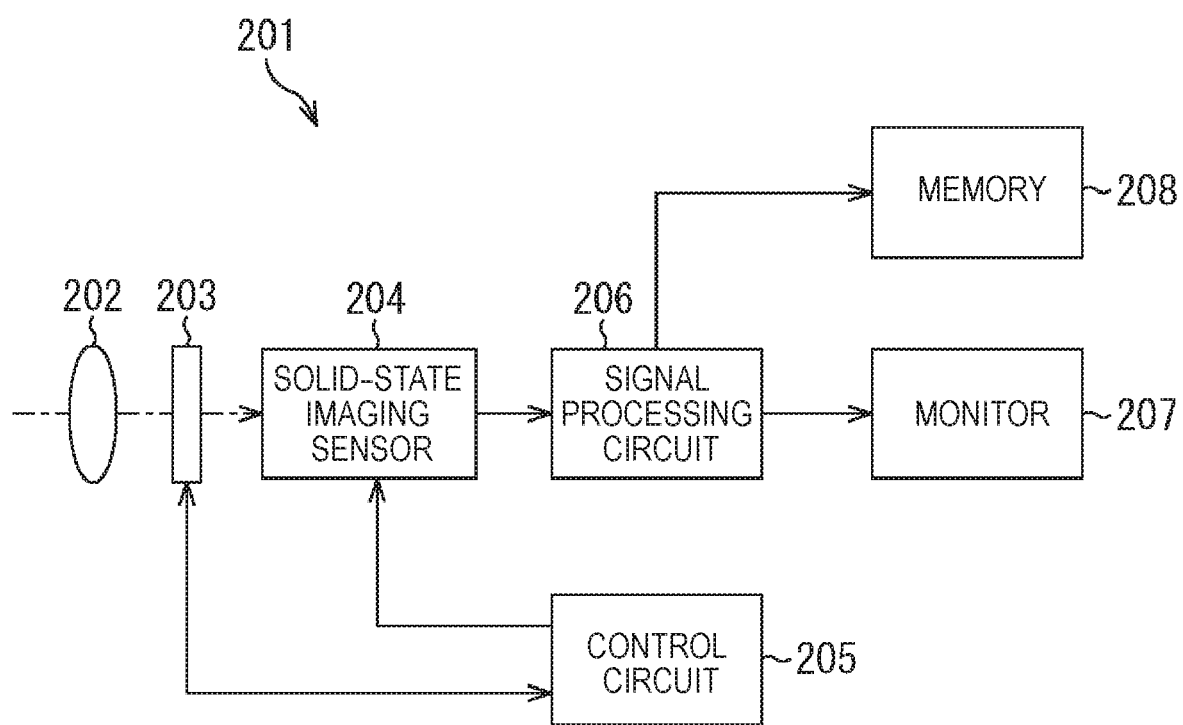
FIG. 18 is a schematic diagram illustrating an application example of an electronic device to which the solid-state imaging sensor according to the present technology is applied.

FIG. 18 is a block diagram illustrating a configuration example of an imaging device as an electronic device to which the present technology is applied.

An imaging device 201 illustrated in FIG. 18 includes an optical system 2202, a shutter device 203, a solid-state imaging sensor 204, a drive circuit 205, a signal processing circuit 206, a monitor 207 and a memory 208, and can image a still image and a moving image.

The optical system 202 includes one or a plurality of lenses, guides light (incident light) from a subject to the solid-state imaging sensor 204, and forms an image on a light receiving surface of the solid-state imaging sensor 204.

The shutter device 203 is disposed between the optical system 202 and the solid-state imaging sensor 204, and controls a light illumination period and a light-blocking period of the solid-state imaging sensor 204 under control of the drive circuit 205.

The solid-state imaging sensor 204 includes a package having the above-described solid-state imaging sensor. The solid-state imaging sensor 204 accumulates signal charges for a constant period according to light whose image is formed on a light receiving surface through the optical system 202 and the shutter device 203. The signal charges accumulated in the solid-state imaging sensor 504 are transferred according to a drive signal (a timing signal) supplied from the drive circuit 205.

The drive circuit 205 outputs a drive signal for controlling a transfer operation of the solid-state imaging sensor 204 and a shutter operation of the shutter device 203 and drives the solid-state imaging sensor 204 and the shutter device 203.

The signal processing circuit 206 performs various types of signal processing of signal charges output from the solid-state imaging sensor 204. An image (image data) obtained by signal processing performed by the signal processing circuit 206 is supplied to and displayed on the monitor 207, and is supplied to and stored (recorded) in the memory 208.

Also in the imaging device 201 with the configuration, in place of the solid-state imaging sensor 204, by applying the solid-state imaging sensor 11, the reflection on the Si substrate 38 can be suppressed to improve the sensitivity and reduce the flare and ghost.

<Use Examples of Solid-State Imaging Sensor>

Figure 19:
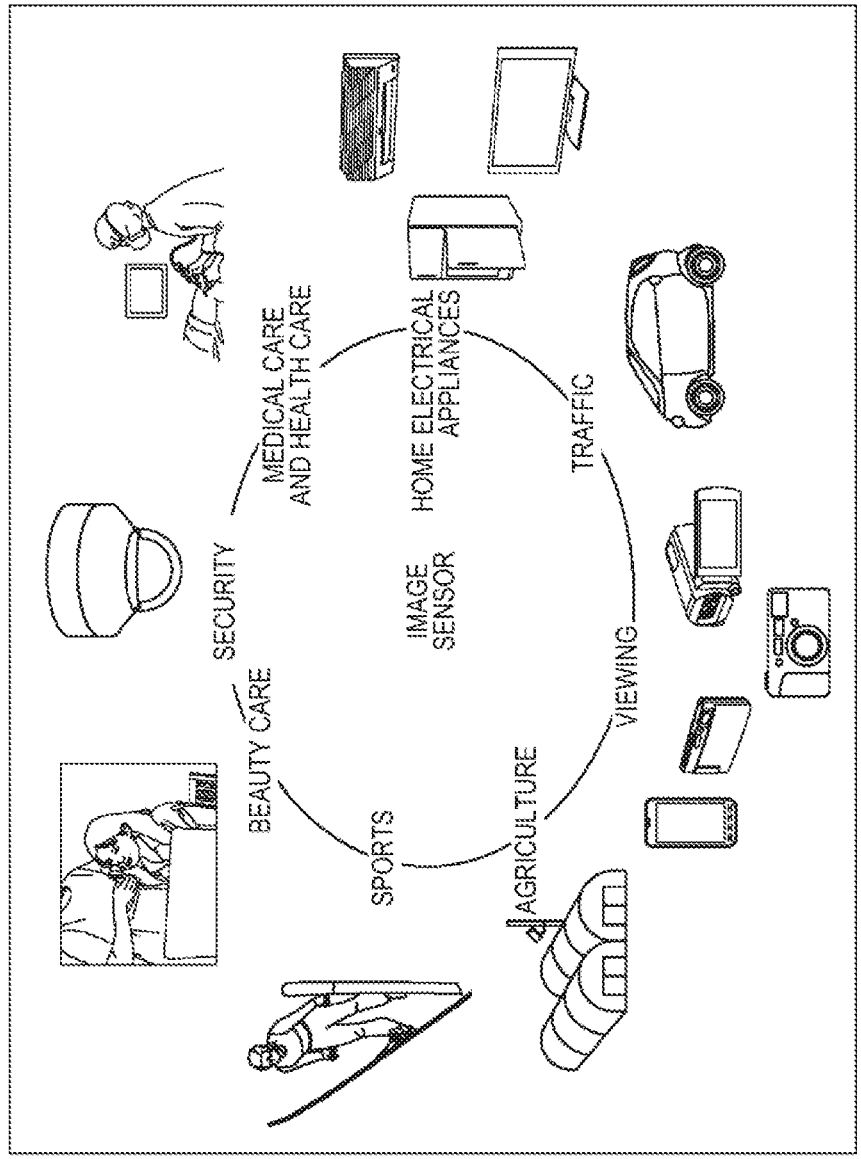
FIG. 19 is a diagram illustrating use examples of a solid-state imaging sensor according to the present technology.

FIG. 19 is a diagram illustrating use examples in which the above-described solid-state imaging sensor is used.

The above-described solid-state imaging sensor can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

Additionally, the present technology may also be configured as below.

(1)

A solid-state imaging sensor including:

a substrate having, per pixel unit, a photoelectric conversion unit configured to generate a pixel signal corresponding to an amount of incident light by photoelectric conversion;

a reflectance adjusting layer provided on the substrate in an incident direction of the incident light with respect to the substrate and configured to adjust reflection of the incident light on the substrate; and an environmental medium provided on the reflectance adjusting layer, in which the reflectance adjusting layer includes a first layer formed on the substrate and a second layer formed on the first layer, the first layer includes a concavo-convex structure provided on the substrate and a material which is filled into a concave portion of the concavo-convex structure and has a refractive index lower than that of the substrate, the second layer includes a material having a refractive index lower than that of the first layer, and the refractive index of the substrate is higher than that of the first layer, the refractive index of the first layer is higher than that of the second layer, and the refractive index of the second layer is higher than that of the environmental medium.

(2)

The solid-state imaging sensor according to (1), in which a product of the refractive index of the first layer and a thickness of the first layer is smaller than $3/8$ times a wavelength of the incident light.

(3)

The solid-state imaging sensor according to (1), in which the first layer includes a plurality of layers, and in a refractive index of each of the plurality of layers, and the refractive index of a layer closer to the substrate is higher among any adjacent layers, in the case where a difference in the refractive index between the respective layers is higher than a predetermined value, a product of the refractive index and the thickness is smaller than $3/8$ times the wavelength of the incident light in each of the plurality of layers, and in the case where the difference in the refractive indexes between the respective layers is lower than a predetermined value, a sum of products of the refractive index and the thickness of each of the plurality of layers is smaller than $3/8$ times the wavelength of the incident light.

(4)

The solid-state imaging sensor according to any one of (1) to (3), in which a product of the refractive index of the second layer and a thickness of the second layer is smaller than $3/8$ times the wavelength of the incident light.

(5)

The solid-state imaging sensor according to any one of (1) to (3), in which the second layer includes a plurality of layers, and in a refractive index of each of the plurality of layers, the refractive index of a layer closer to the substrate is higher among any adjacent layers, in the case where a difference in the refractive index between the respective layers is higher than a predetermined value, a product of the refractive index and the thickness is smaller than $3/8$ times the wavelength of the incident light in each of the plurality of layers, and in the case where the difference in the refractive indexes between the respective layers is lower than a predetermined value, a sum of products of the refractive index and the thickness of each of the plurality of layers is smaller than $3/8$ times the wavelength of the incident light.

(6)

The solid-state imaging sensor according to any one of (1) to (5), in which the refractive index of the first layer is a sum of products of volume ratios with the respective refractive indexes of a convex portion in the concavo-convex structure of the first layer including the same material as that of the substrate and the concave portion to which the material with the low refractive index is filled.

(7)

The solid-state imaging sensor according to any one of (1) to (6), in which
the substrate includes Si and InGaAs, a material filled into a concave portion of the first layer includes an oxidized film or a nitride film containing at least one kind of Hf, Al, Ti, Zr, Ta, Nb, Y, and Sr, and the environmental medium includes a lens, a color filter, and an oxidized film.

(8)

The solid-state imaging sensor according to (7), in which
a material filled into the concave portion of the first layer includes SiN, HfO2, Ta2O5, Nb2O5, TiO2, Al2O3, and ZrO2.

(9)

The solid-state imaging sensor according to any one of (1) to (8), in which
a material filled into the concave portion of the first layer is the same material as that of the second layer.

(10)

The solid-state imaging sensor according to any one of (1) to (9), in which
a material filled into the concave portion of the first layer is the material with high dielectric constant.

(11)

The solid-state imaging sensor according to any one of (1) to (10), in which
the concavo-convex structure provided on the substrate is configured by using photolithography or etching using directed self assembly (DSA).

(12)

The solid-state imaging sensor according to any one of (1) to (11), in which
a boundary per the pixel unit includes an oxidized-film boundary portion including an oxidized film.

(13)

The solid-state imaging sensor according to (12), in which
the pixel includes an image-plane phase difference focus pixel.

(14)

The solid-state imaging sensor according to any one of (1) to (13), in which
a boundary per the pixel unit includes a metallic boundary portion including a metal.

(15)

The solid-state imaging sensor according to (14), in which
the metal includes tungsten.

(16)

The solid-state imaging sensor according to (14), in which
the pixel includes an image-plane phase difference focus pixel.

(17)

The solid-state imaging sensor according to (14), in which:
a light shielding unit which is the boundary per the pixel unit and which includes the same metal as that of the metallic boundary portion and shields the incident light onto an adjacent pixel to surround the pixel in a direction facing to an incident direction of the incident light.

(18)

The solid-state imaging sensor according to (17), in which
the pixel includes an image-plane phase difference focus pixel.

REFERENCE SIGNS LIST 11 solid-state imaging sensor
31 lens
32 color filter
33 planarized film
34 light shielding film
34a boundary portion
35 oxidized film
35a boundary portion
36, 36-1, 36-2 intermediate second layer
36a boundary portion
37, 37-1, 37-2 intermediate first layer
37a, 37a' concave portion
38 Si substrate

What is claimed is:

1. A solid-state imaging sensor, comprising:
a plurality of pixel units;
a substrate including a plurality of photoelectric conversion units;
a first layer including a plurality of concave portions, the first layer disposed over the photoelectric conversion units in a cross sectional view;
a second layer disposed on the first layer;
a third layer disposed on the second layer;
wherein each of the unit pixels includes at least one photoelectric conversion unit and at least first and second concave portions for the at least one photoelectric conversion unit,
wherein the second concave portion is adjacent to the first concave portion in a width direction of the concave portions, and
wherein an interface between the first layer and the second layer includes a flat portion disposed between the first concave portion and the second concave portion.

2. The solid-state imaging sensor according to claim 1, wherein the substrate includes a first material, wherein the first layer includes the first material and a second material, wherein the second layer includes the second material, and wherein the third layer includes a third material.

3. The solid-state imaging sensor according to claim 2, wherein the concave portions include the second material.

4. The solid-state imaging sensor according to claim 1, further including a trench disposed between the plurality of pixel units.

5. The solid-state imaging sensor according to claim 4, wherein the trench includes the same material as that of the second layer.

6. The solid-state imaging sensor according to claim 4, further including a light shielding film disposed over the trench.

7. An electronic apparatus, comprising:
an optical system;
a shutter; and
a light detecting device, including:
a plurality of pixel units;
a substrate including a plurality of photoelectric conversion units;
a first layer including a plurality of concave portions, the first layer disposed over the photoelectric conversion units in a cross sectional view;
a second layer disposed on the first layer;
a third layer disposed on the second layer;
wherein each of the unit pixels includes at least one photoelectric conversion unit and at least first and second concave portions for the at least one photoelectric conversion unit,
wherein the second concave portion is adjacent to the first concave portion in a width direction of the concave portions, and wherein an interface between the first layer and the second layer includes a flat portion disposed between the first concave portion and the second concave portion.

\* \* \* \* \*